United States Patent
Kim

(10) Patent No.: US 12,041,768 B2
(45) Date of Patent: Jul. 16, 2024

(54) SEMICONDUCTOR DEVICE AND MANUFACTURING METHOD OF THE SEMICONDUCTOR DEVICE

(71) Applicant: SK hynix Inc., Icheon-si (KR)

(72) Inventor: Jae Taek Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 439 days.

(21) Appl. No.: 17/327,209

(22) Filed: May 21, 2021

(65) Prior Publication Data
US 2022/0165740 A1   May 26, 2022

(30) Foreign Application Priority Data

Nov. 24, 2020 (KR) .................. 10-2020-0158815

(51) Int. Cl.
  *H10B 43/27*  (2023.01)
  *H10B 41/10*  (2023.01)
  *H10B 41/27*  (2023.01)
  *H10B 43/10*  (2023.01)

(52) U.S. Cl.
  CPC ............. *H10B 41/27* (2023.02); *H10B 41/10* (2023.02); *H10B 43/10* (2023.02); *H10B 43/27* (2023.02)

(58) Field of Classification Search
  CPC ............................... H10B 43/27; H10B 43/20
  See application file for complete search history.

(56) References Cited

U.S. PATENT DOCUMENTS

| | | |
|---|---|---|
| 10,115,681 B1 | 10/2018 | Ariyoshi |
| 10,680,012 B2 | 6/2020 | Asai et al. |
| 2015/0303214 A1* | 10/2015 | Kim ............... H01L 29/7827 257/329 |
| 2020/0273881 A1* | 8/2020 | Kim ................. H10B 41/10 |
| 2021/0091105 A1 | 3/2021 | Kim et al. |
| 2021/0375905 A1* | 12/2021 | Hwang ............. H10B 41/27 |
| 2022/0037351 A1 | 2/2022 | Lee et al. |
| 2022/0051979 A1 | 2/2022 | Kuroko et al. |

* cited by examiner

*Primary Examiner* — Christopher A Johnson
(74) *Attorney, Agent, or Firm* — WILLIAM PARK & ASSOCIATES LTD.

(57) ABSTRACT

A semiconductor device includes: a cell stack structure including first cell stack layers and stack conductive layers, which are alternately stacked; a cell plug penetrating the cell stack structure; and a cell chip guard surrounding the cell stack structure and the cell plug. The cell chip guard includes a guard semiconductor layer and a guard insulating layer covering a sidewall of the guard semiconductor layer.

21 Claims, 20 Drawing Sheets

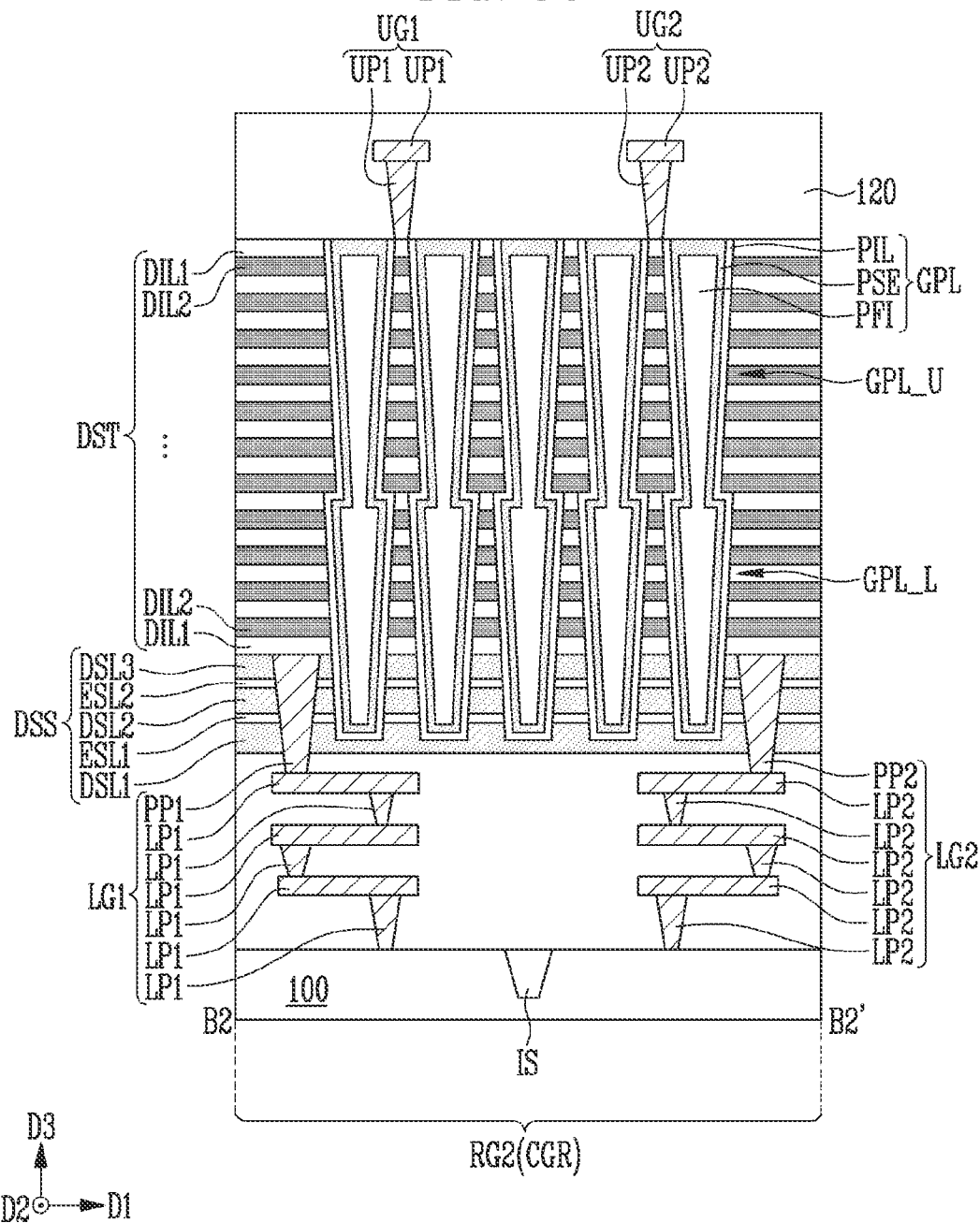

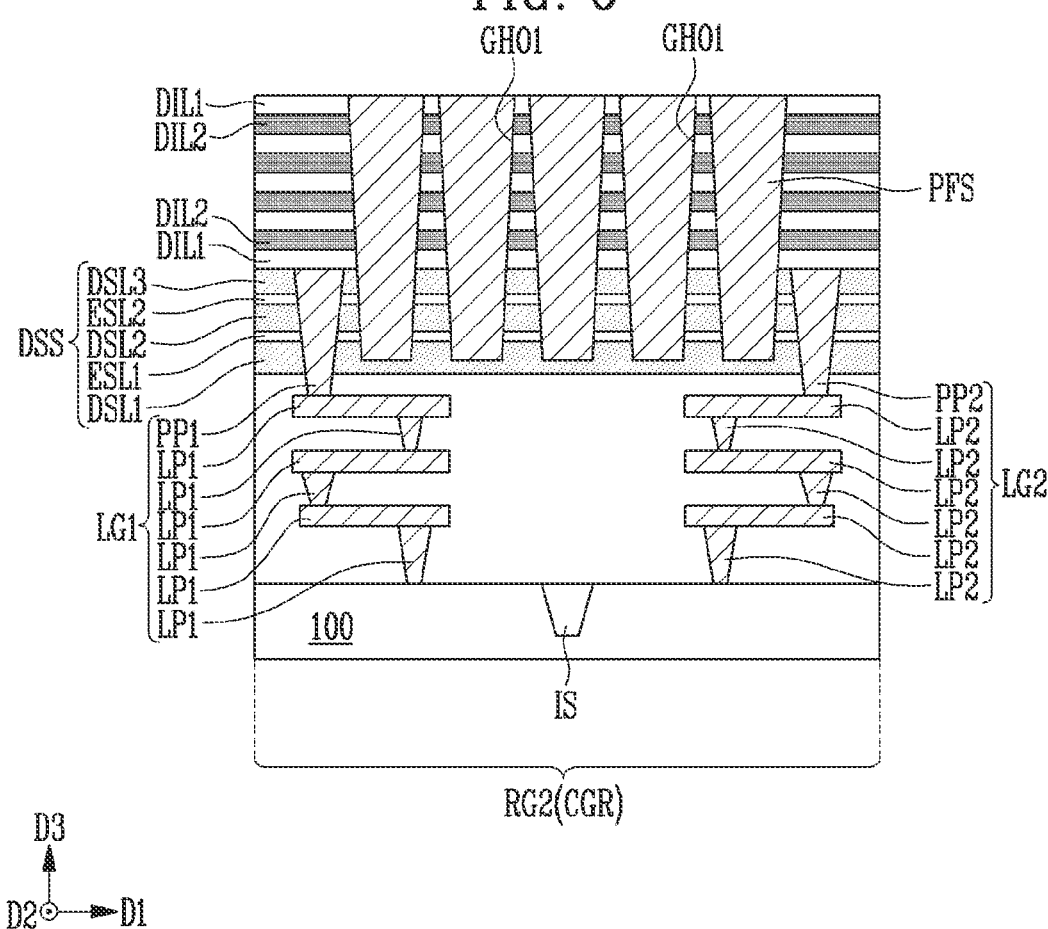

US 12,041,768 B2

SEMICONDUCTOR DEVICE AND MANUFACTURING METHOD OF THE SEMICONDUCTOR DEVICE

CROSS-REFERENCE TO RELATED APPLICATION

The present application claims priority under 35 U.S.C. § 119(a) to Korean patent application number 10-2020-0158815, filed on Nov. 24, 2020, in the Korean Intellectual Property Office, the entire disclosure of which is incorporated herein by reference.

BACKGROUND

1. Technical Field

The present disclosure generally relates to a semiconductor device and a manufacturing method of the semiconductor device, and more particularly, to a three-dimensional semiconductor device and a manufacturing method of the three-dimensional semiconductor device.

2. Related Art

A semiconductor device includes memory cells capable of storing data. A three-dimensional semiconductor device includes three-dimensionally arranged memory cells, so that an area occupied by memory cells of a substrate can be reduced.

In order to improve the degree of integration of the three-dimensional semiconductor device, a stacked number of memory cells may be increased. The operational reliability of the three-dimensional semiconductor device may be deteriorated as the stacked number of memory cells is increased.

SUMMARY

In accordance with an aspect of the present disclosure, there may be provided a semiconductor device including: a cell stack structure including first cell stack layers and stack conductive layers, which are alternately stacked; a cell plug penetrating the cell stack structure; and a cell chip guard surrounding the cell stack structure and the cell plug, wherein the cell chip guard includes a guard semiconductor layer and a guard insulating layer covering a sidewall of the guard semiconductor layer.

In accordance with another aspect of the present disclosure, there may be provided a semiconductor device including: a cell stack structure including stack conductive layers and first cell stack layers, which are alternately stacked; a cell plug penetrating the cell stack structure; and guard plugs surrounding the cell stack structure and the cell plug, wherein the guard plugs include a plug semiconductor layer and a plug insulating layer surrounding the plug semiconductor layer.

In accordance with still another aspect of the present disclosure, there may be provided a semiconductor device including: a cell stack structure including stack conductive layers and first cell stack layers, which are alternately stacked; a cell plug penetrating the cell stack structure; a first cell chip guard surrounding the cell stack structure and the cell plug; a cell source structure connected to the cell plug; and a first dummy source structure connected to the first cell chip guard, wherein the first dummy source structure surrounds the cell source structure.

In accordance with still another aspect of the present disclosure, there may be provided a method of manufacturing a semiconductor device, the method including: forming first cell stack layers and second cell stack layers, which are alternately stacked, and first dummy stack layers and second dummy stack layers, which are alternately stacked; forming a cell hole penetrating the first and second cell stack layers and a guard trench penetrating the first and second dummy stack layers, wherein the guard trench surrounds the cell hole; forming a first material layer covering surfaces of the cell hole and the guard trench; and forming a second material layer covering a surface of the first material layer.

In accordance with still another aspect of the present disclosure, there may be provided a method of manufacturing a semiconductor device, the method including: forming first cell stack layers and second cell stack layers, which are alternately stacked, and first dummy stack layers and second dummy stack layers, which are alternately stacked; forming a cell hole penetrating the first and second cell stack layers and guard holes penetrating the first and second dummy stack layers, wherein the guard holes surround the cell hole; forming a first material layer covering surfaces of the cell hole and the guard holes; and forming a second material layer covering a surface of the first material layer.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, the terms 'first' and 'second' are used to distinguish one component from another component. The terms may be used to describe various components, but the components are not limited by the terms.

Figure 1A:
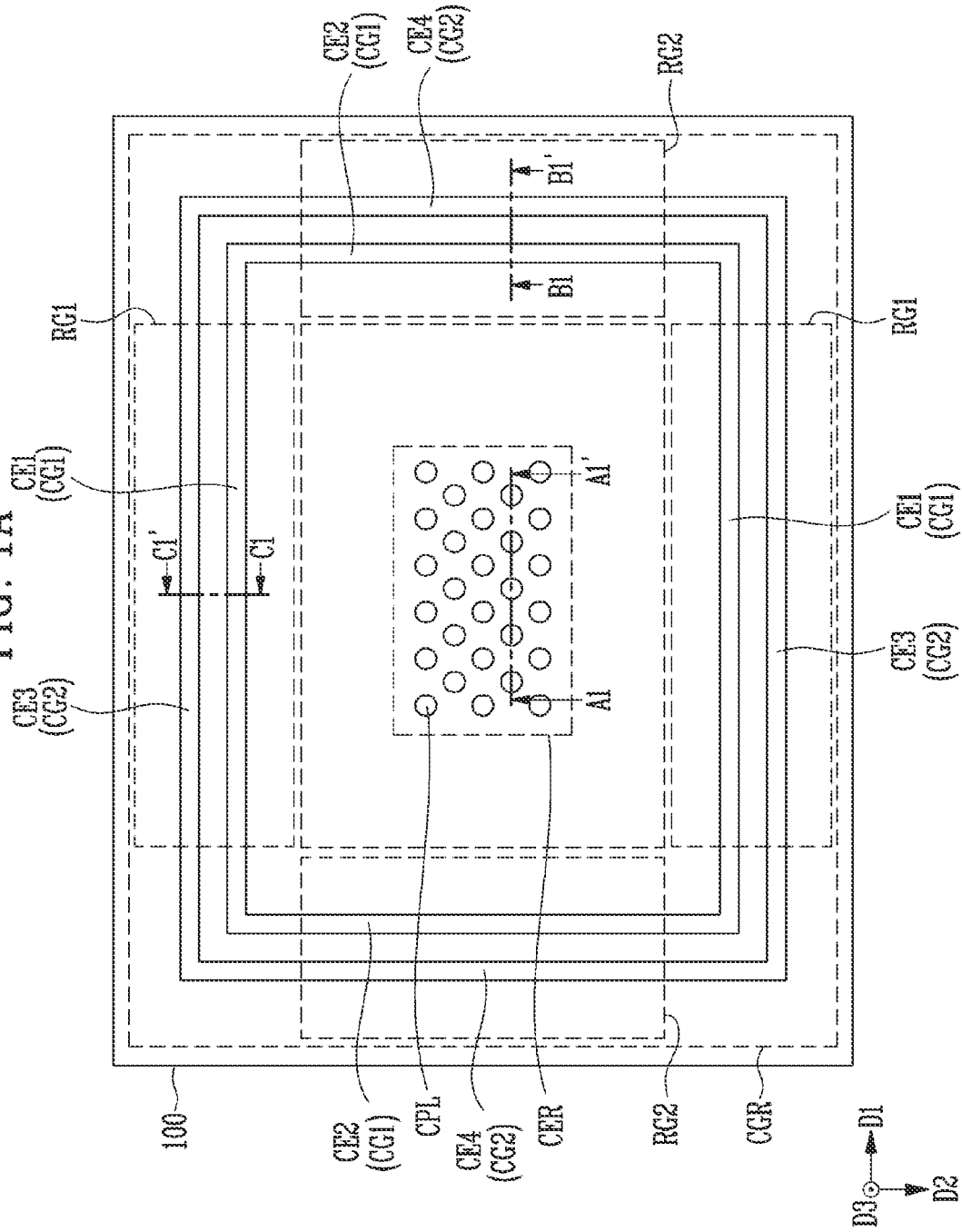

FIG. 1A is a plan view of a semiconductor device in accordance with embodiments of the present disclosure.

Figure 1B:
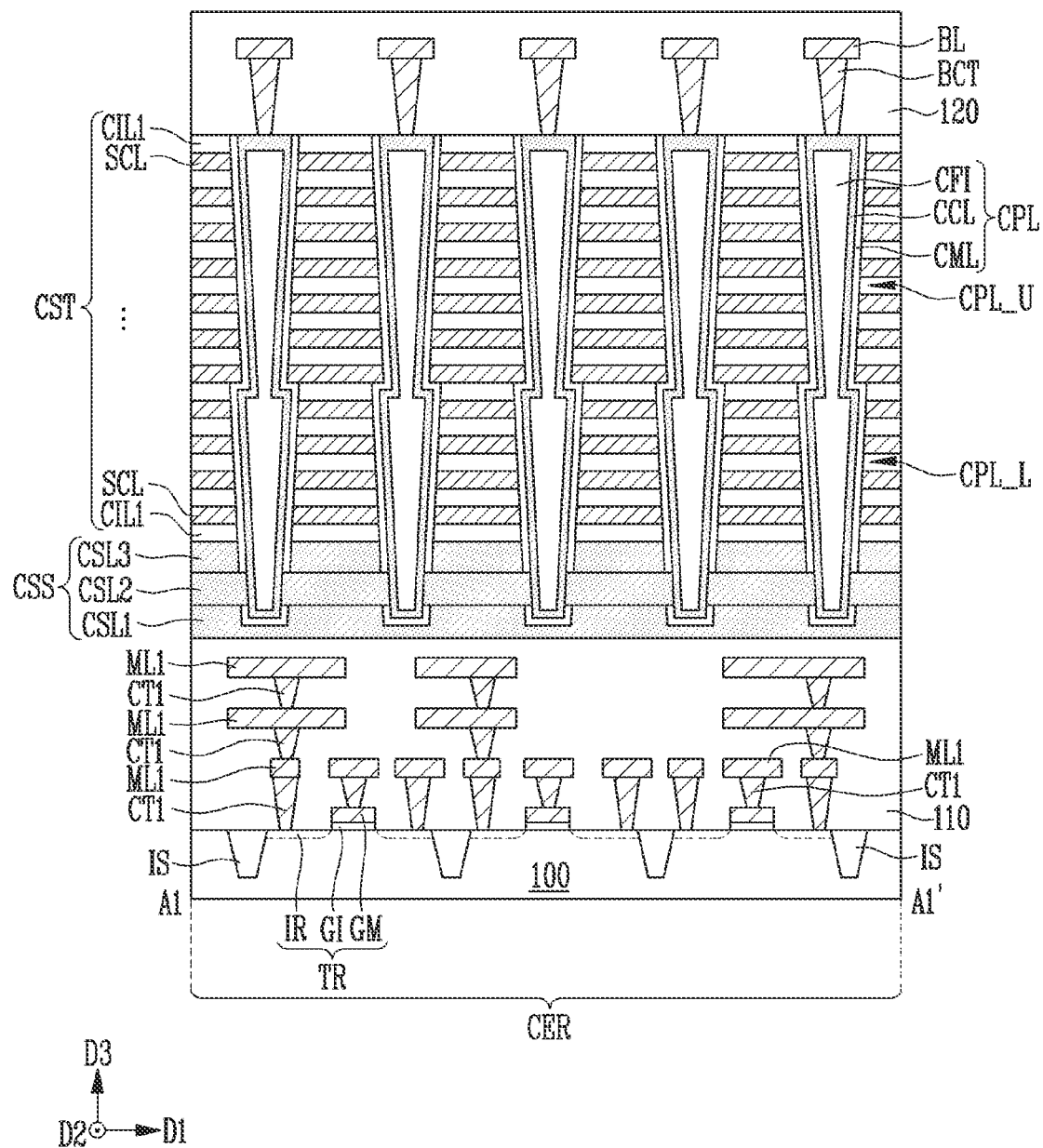

FIG. 1B is a sectional view taken along line A1-A1' shown in FIG. 1A.

Figure 1C:
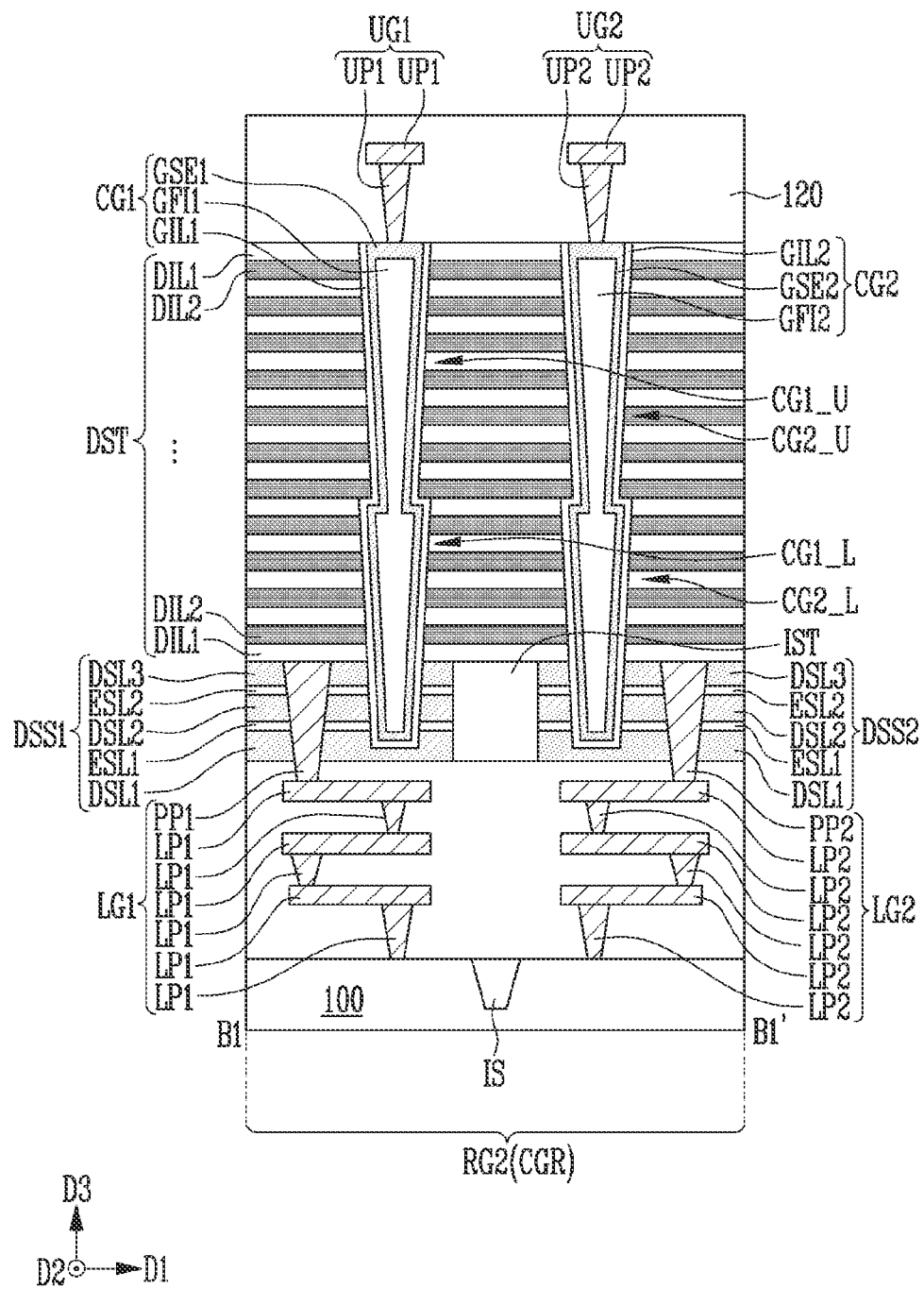

FIG. 1C is a sectional view taken along line B1-B1' shown in FIG. 1A.

Figure 1D:
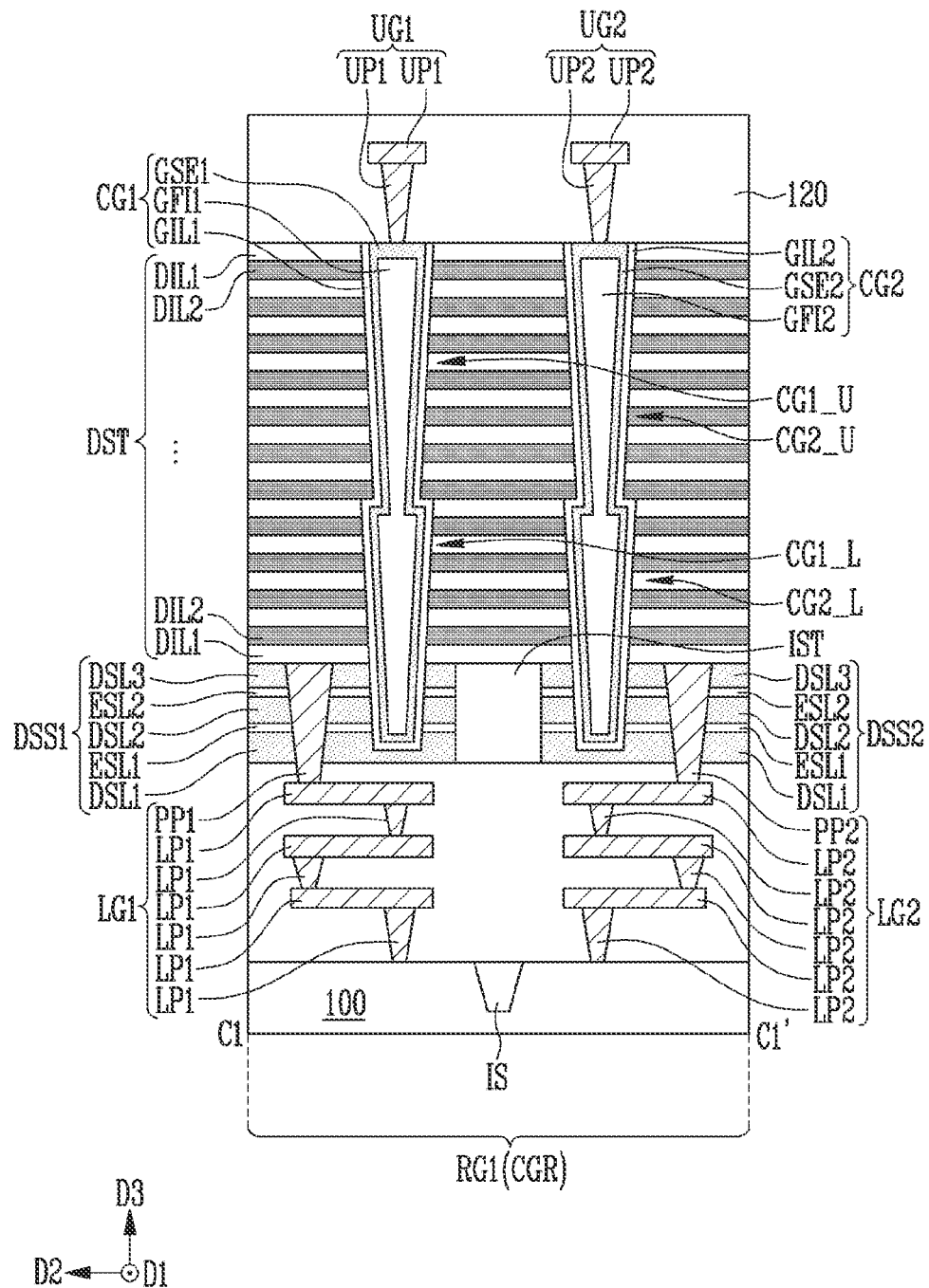

FIG. 1D is a sectional view taken along line C1-C1' shown in FIG. 1A.

Figure 1E:
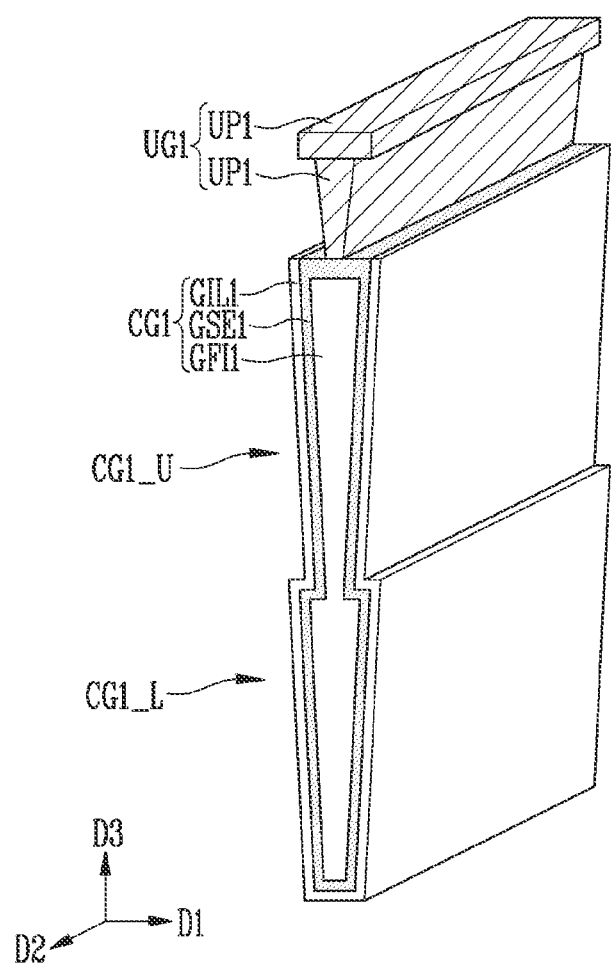

FIG. 1E is a perspective view illustrating a cell chip guard and an upper chip guard of the semiconductor device in accordance with the embodiments shown in FIGS. 1A to 1D.

Figure 1F:
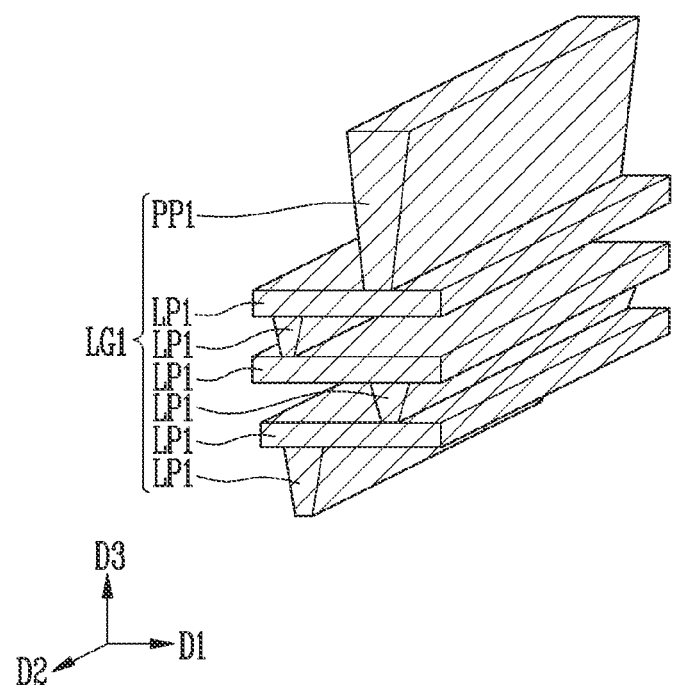

FIG. 1F is a perspective view illustrating a lower chip guard of the semiconductor device in accordance with the embodiments shown in FIGS. 1A to 1D.

FIGS. 2A, 2B, 3A, 3B, 4A, and 4B are sectional views illustrating a manufacturing method of the semiconductor device in accordance with embodiments of the present disclosure.

Figure 5A:
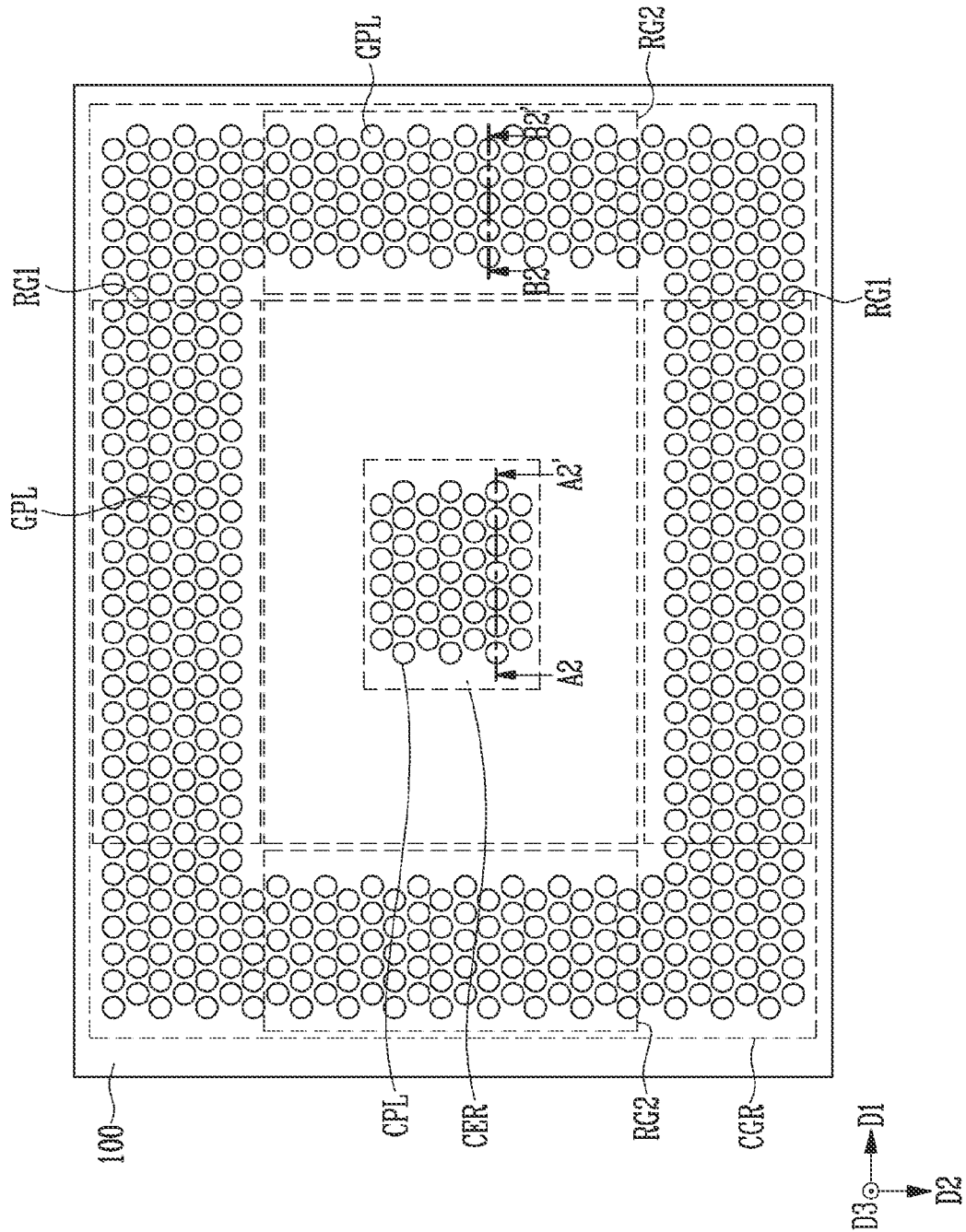

FIG. 5A is a plan view of a semiconductor device in accordance with embodiments of the present disclosure.

Figure 5B:
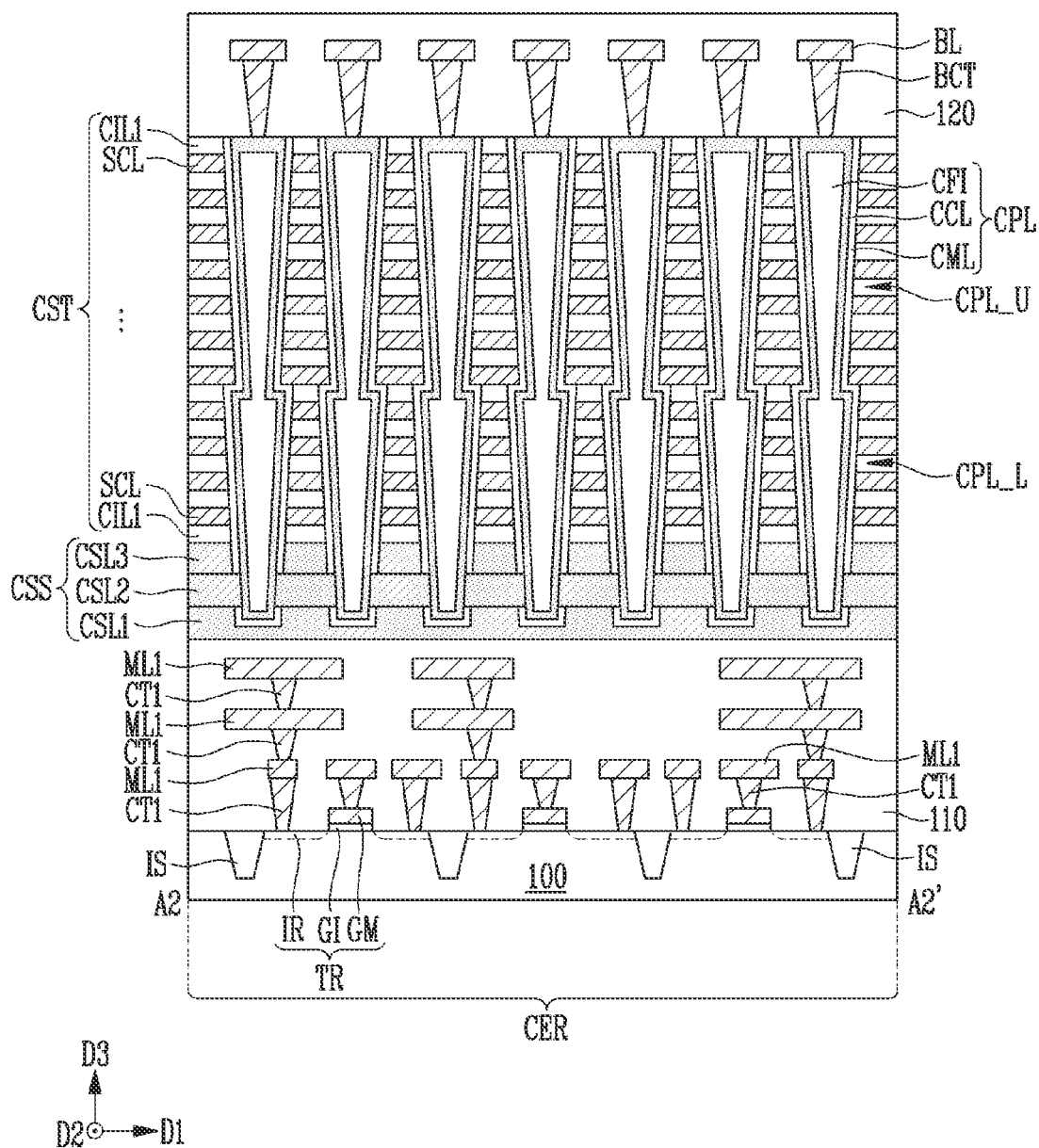

FIG. 5B is a sectional view taken along line A2-A2' shown in FIG. 5A.

FIG. 5C is a sectional view taken along line B2-B2' shown in FIG. 5A.

Figure 5D:
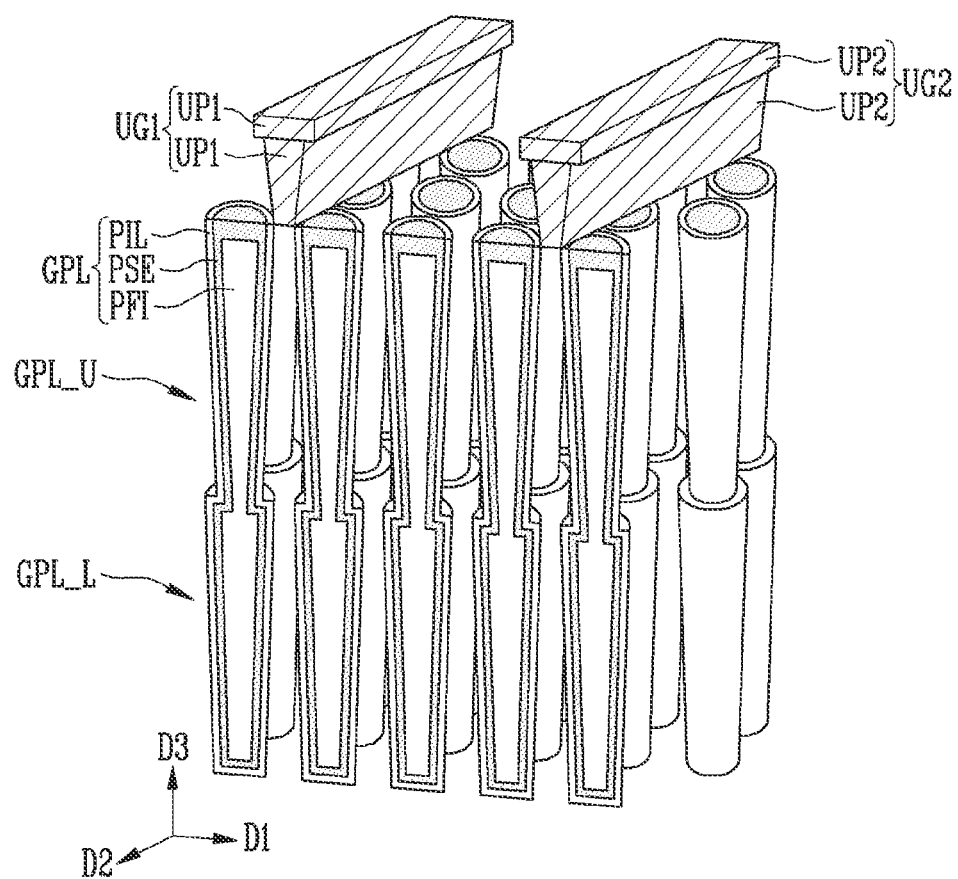

FIG. 5D is a perspective view illustrating a guard plug and an upper chip guard of the semiconductor device in accordance with the embodiments shown in FIGS. 5A to 5C.

Figure 7:
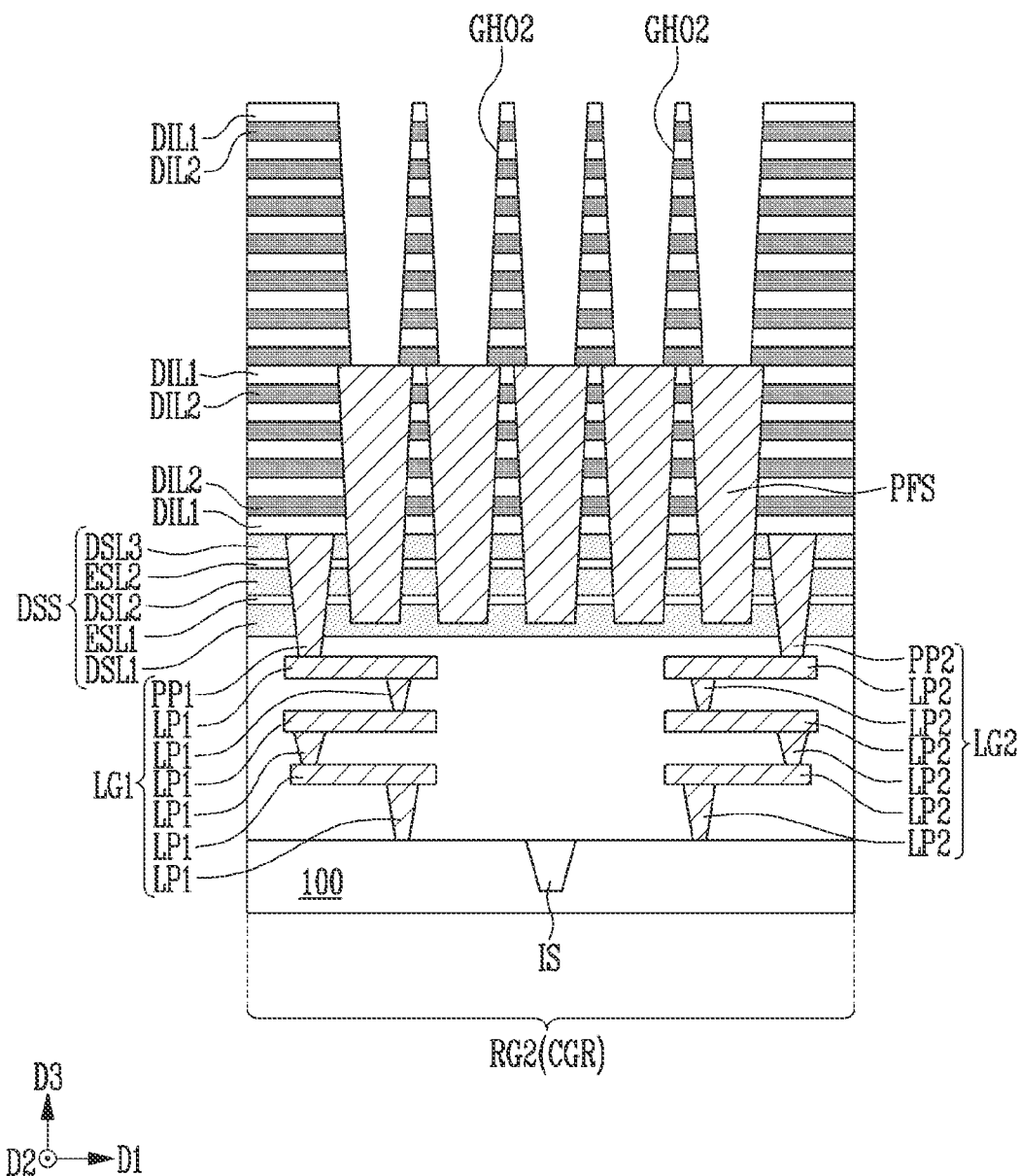
Figure 8:
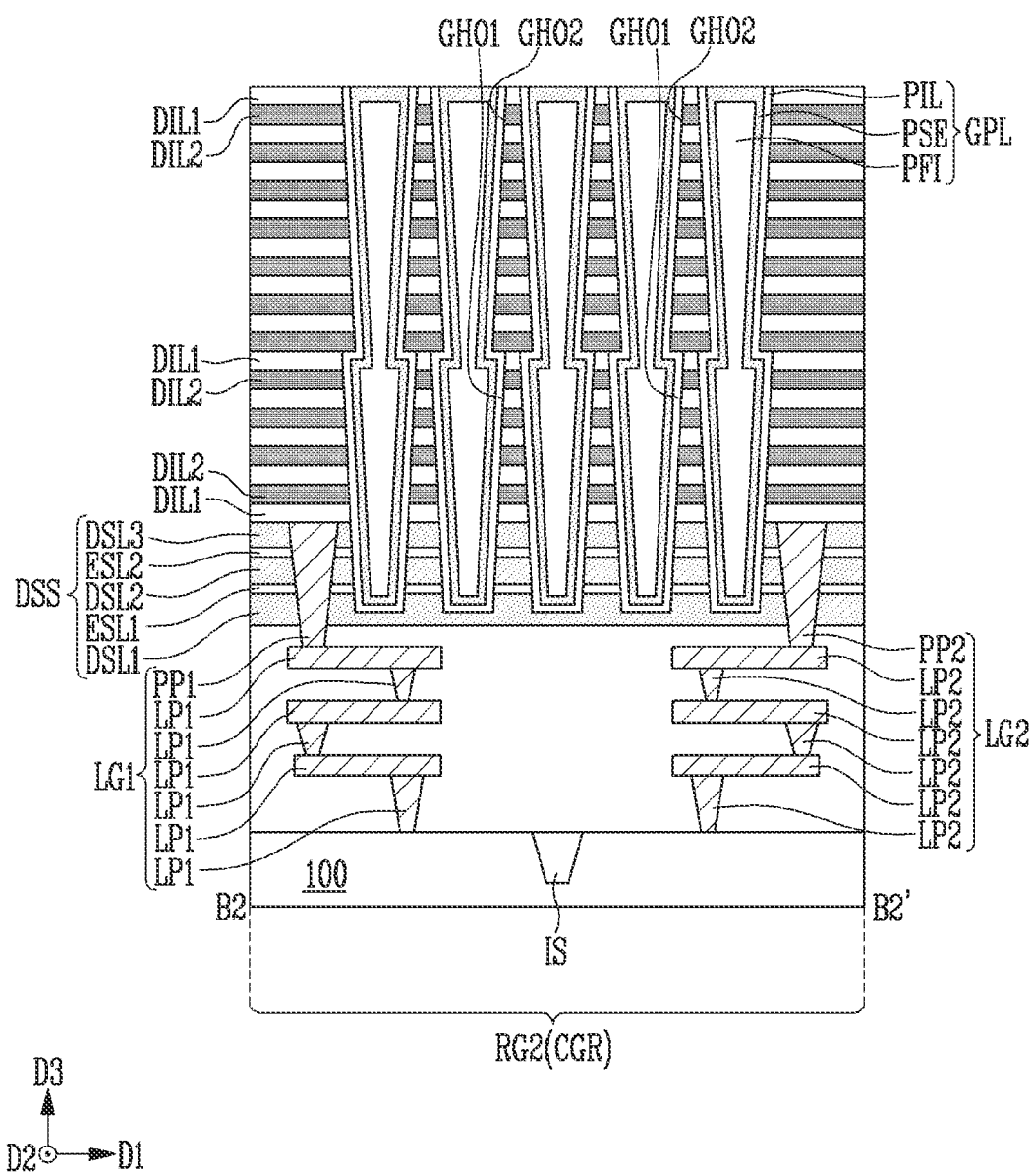

FIGS. 6, 7, and 8 are sectional views illustrating a manufacturing method of the semiconductor device in accordance with embodiments of the present disclosure.

Figure 9:
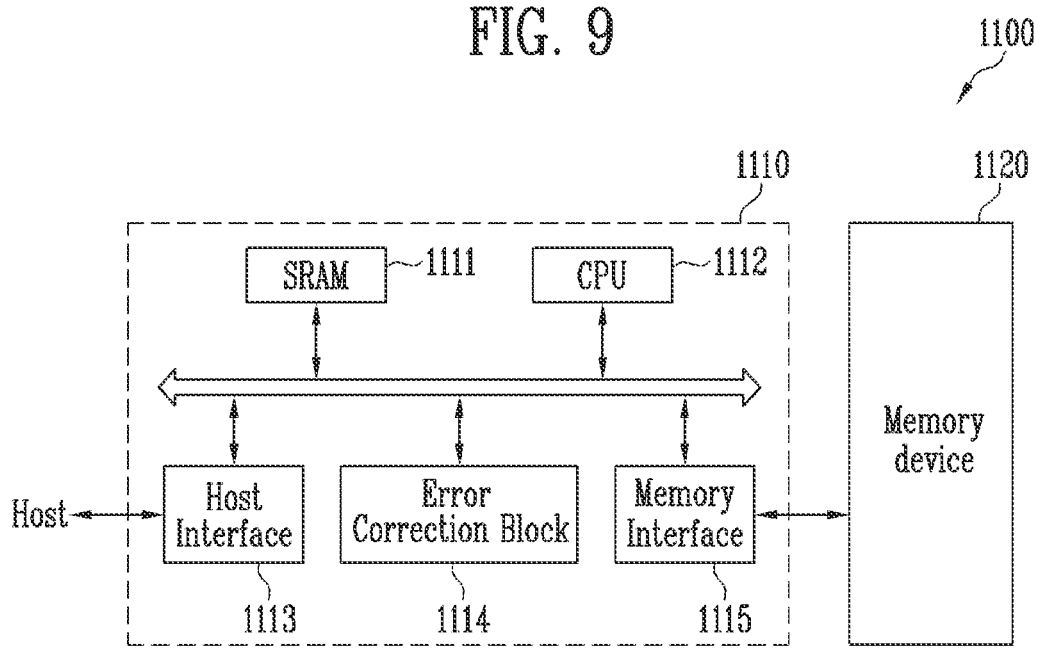

FIG. 9 is a block diagram illustrating a configuration of a memory system in accordance with an embodiment of the present disclosure.

Figure 10:
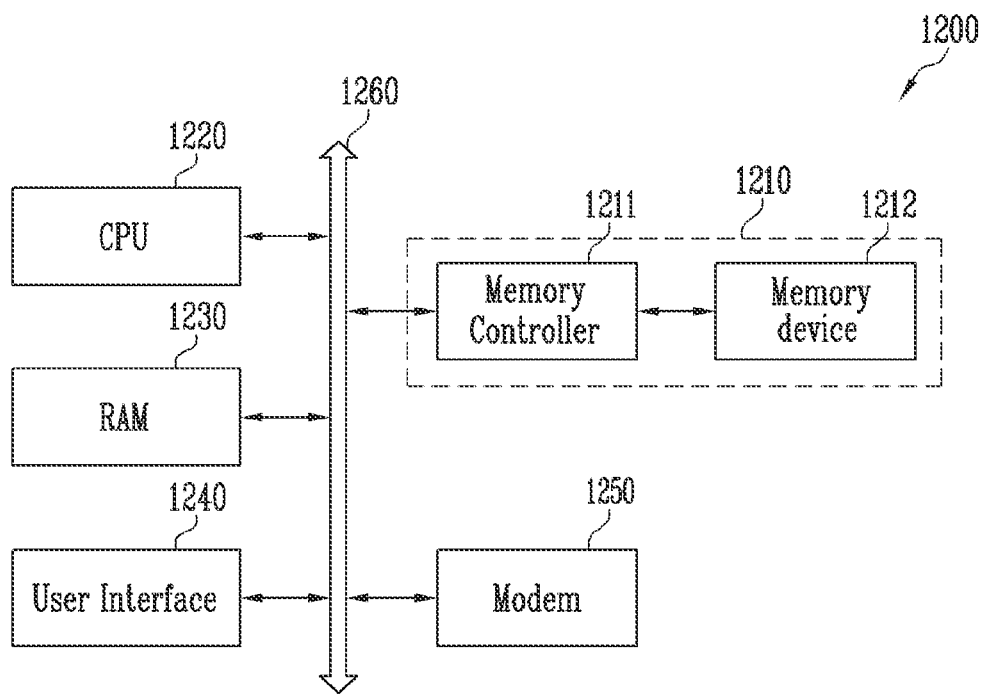

FIG. 10 is a block diagram illustrating a configuration of a computing system in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments may provide a semiconductor device having improved operational reliability and a manufacturing method of the semiconductor device.

FIG. 1A is a plan view of a semiconductor device in accordance with embodiments of the present disclosure. For ease of description, FIG. 1A is shown without bit lines BL, bit line contacts BCT, a second insulating layer 120, and the first and second upper chip guards UG1 and UG2. FIG. 1B is a sectional view taken along line A1-A1' shown in FIG. 1A. FIG. 1C is a sectional view taken along line B1-B1' shown in FIG. 1A. FIG. 1D is a sectional view taken along line C1-C1' shown in FIG. 1A. FIG. 1E is a perspective view illustrating a cell chip guard and an upper chip guard of the semiconductor device in accordance with the embodiments shown in FIGS. 1A to 1D. FIG. 1F is a perspective view illustrating a lower chip guard of the semiconductor device in accordance with the embodiments shown in FIGS. 1A to 1D.

Referring to FIGS. 1A to 1D, the semiconductor device may include a substrate 100. The substrate 100 may have the shape of a plate expanding along a plane defined by a first direction D1 and a second direction D2. The first direction D1 and the second direction D2 may intersect each other. In an example, the first direction D1 and the second direction D2 may be orthogonal to each other. The substrate 100 may be a semiconductor substrate. In an example, the substrate 100 may be a silicon substrate.

The substrate 100 may include a cell region CER and a chip guard region CGR. The cell region CER and the chip guard region CGR may be regions distinguished from each other on a plane. The chip guard region CGR may surround the cell region CER.

The chip guard region CGR may include first regions RG1 and second regions RG2. The first regions RG1 may extend in the first direction D1. The second regions RG2 may extend in the second direction D2. The first regions RG1 may be spaced apart from each other in the second direction D2. The cell region CER may be disposed between the first regions RG1. The second regions RG2 may be spaced apart from each other in the first direction D1. The cell region CER may be disposed between the second regions RG2.

A first insulating layer 110 may be provided, which covers the substrate 100. The first insulating layer 110 may include an insulating material. In an example, the first insulating layer 110 may include oxide or nitride. The first insulating layer 110 may be a multi-layer including a plurality of insulating layers.

Peripheral transistors TR may be provided between the substrate 100 and the first insulating layer 110. The peripheral transistors TR may be disposed on the cell region CER of the substrate 100. The peripheral transistors TR may constitute a peripheral circuit of the semiconductor device, or be transistors connected to the peripheral circuit of the semiconductor device.

Each of the peripheral transistors TR may include impurity regions IR, a gate insulating layer GI, and a gate electrode GM. The impurity regions IR of the peripheral transistor TR may be spaced apart from each other with the gate insulating layer GI interposed therebetween. A channel of the peripheral transistor TR may be disposed between the impurity regions IR. The gate electrode GM may be spaced apart from the channel of the peripheral transistor TR by the gate insulating layer GI. The impurity regions IR may be formed by doping an impurity into the substrate 100. The gate insulating layer GI may include an insulating material. In an example, the gate insulating layer GI may include oxide. The gate electrode GM may include a conductive material. In an example, the gate electrode GM may include tungsten.

Isolation layers IS may be provided in the substrate 100. The isolation layers IS may electrically isolate regions of the substrate 100 from each other. The isolation layers IS may include an insulating material. In an example, the isolation layers IS may include oxide.

First contacts CT1 and first lines ML1 may be provided in the first insulating layer 110. The first contacts CT1 and the first lines ML1 may be provided on the cell region CER of the substrate 100. Each of the first contacts CT1 may connect the peripheral transistor TR and the first line ML1 to each other, and connect the first lines ML1 to each other. The first line ML1 may be connected to the first contact CT1. The first contacts CT1 and the first lines ML1 may include a conductive material. In an example, the first contacts CT1 and the first lines ML1 may include tungsten.

A cell source structure CSS, a first dummy source structure DSS1, and a second dummy source structure DSS2 may be provided on the first insulating layer 110. The cell source structure CSS may be provided on the cell region CER of the substrate 100. The first dummy source structure DSS1 and the second dummy source structure DSS2 may be provided on the chip guard region CGR of the substrate 100. The first dummy source structure DSS1 may surround the cell source structure CSS. The second dummy source structure DSS2 may surround the cell source structure CSS and the first dummy source structure DSS1.

The cell source structure CSS may include a first cell source layer CSL1, a second cell source layer CSL2, and a third cell source layer CSL3, which are sequentially stacked in a third direction D3. The third direction D3 may be a direction intersecting the first direction D1 and the second direction D2. In an example, the third direction D3 may be a direction orthogonal to the first direction D1 and the second direction D2. The second cell source layer CSL2 may be disposed on the first cell source layer CSL1, and the third cell source layer CSL3 may be disposed on the second cell source layer CSL2. The first to third cell source layers CSL1, CSL2, and CSL3 may include a conductive material. In an example, the first to third cell source layers CSL1, CSL2, and CSL3 may include doped poly-silicon.

Each of the first dummy source structure DSS1 and the second dummy source structure DSS2 may include a first dummy source layer DSL1, a first etch stop layer ESL1, a second dummy source layer DSL2, a second etch stop layer ESL2, and a third dummy source layer DSL3, which are sequentially stacked in the third direction D3. The first etch stop layer ESL1 may be disposed on the first dummy source layer DSL1. The second dummy source layer DSL2 may be disposed on the first etch stop layer ESL1, and the second etch stop layer ESL2 may be disposed on the second dummy source layer DSL2. The third dummy source layer DSL3 may be disposed on the second etch stop layer ESL2.

The first dummy source layer DSL1 may be disposed at the same level as the first cell source layer CSL1. The third dummy source layer DSL3 may be disposed at the same level as the third cell source layer CSL3. The first to third dummy source layers DSL1, DSL2, and DSL3 may include a semiconductor material. In an example, the first to third dummy source layers DSL1, DSL2, and DSL3 may include poly-silicon. The first and second etch stop layers ESL1 and ESL2 may include a material having an etch selectivity with respect to that which the first to third dummy source layers DSL1, DSL2, and DSL3 include. In an example, the first and second etch stop layers ESL1 and ESL2 may include oxide.

Although a case where a number of the dummy source structures DSS1 and DSS2 is two has been illustrated and described, the number of the dummy source structures DSS1 and DSS2 might not be limited thereto. In an example, the number of the dummy source structures DSS1 and DSS2 may be one or be three or more.

An insulating structure IST may be provided between the first and second dummy source structures DSS1 and DSS2. The insulating structure IST may be disposed on the chip guard region CGR of the substrate 100. The first and second dummy source structures DSS1 and DSS2 may be spaced apart from each other by the insulating structure IST. The insulating structure IST may include an insulating material. In an example, the insulating structure IST may include oxide.

A first lower chip guard LG1 may be provided in the first insulating layer 110 and the first dummy source structure DSS1. A second lower chip guard LG2 may be provided in the first insulating layer 110 and the second dummy source structure DSS2. The first and second lower chip guards LG1 and LG2 may be disposed on the chip guard region CGR of the substrate 100. Although a case where a number of the lower chip guards LG1 and LG2 is two has been illustrated and described, the number of the lower chip guards LG1 and LG2 might not be limited thereto. In an example, the number of the lower chip guards LG1 and LG2 may be one or be three or more. The first and second lower chip guards LG1 and LG2 will be described later.

A cell stack structure CST may be provided on the cell source structure CSS. The cell stack structure CST may be provided on the cell region CER of the substrate 100. The cell stack structure CST may include stack conductive layers SCL and first cell stack layers CIL1, which are alternately stacked in the third direction D3. The stack conductive layers SCL may be used as word lines or select lines of the semiconductor device. The stack conductive layers SCL may include a conductive material. In an example, the stack conductive layers SCL may include tungsten. The first cell stack layers CIL1 may include an insulating material. In an example, the first cell stack layers CIL1 may include oxide.

Cell plugs CPL may be provided, which penetrate the cell stack structure CST. The cell plugs CPL may be provided on the cell region CER of the substrate 100. The cell plugs CPL may extend in the third direction D3. The cell plug CPL may include a cell filling layer CFI, a cell channel layer CCL surrounding the cell filling layer CFI, and a cell memory layer CML surrounding the cell channel layer CCL. The cell filling layer CFI, the cell channel layer CCL, and the cell memory layer CML may penetrate the cell stack structure CST while extending in the third direction D3.

The cell filling layer CFI may include an insulating material. In an example, the cell filling layer CFI may include oxide. The cell channel layer CCL may include a semiconductor material. In an example, the cell channel layer CCL may include poly-silicon. The cell memory layer CML may include a tunnel insulating layer surrounding the cell channel layer CCL, a data storage layer surrounding the tunnel insulating layer, and a blocking layer surrounding the data storage layer. The tunnel insulating layer may include a material through which charges can tunnel. In an example, the tunnel insulating layer may include oxide. In an embodiment, the data storage layer may include a material in which charges can be trapped. In an example, the data storage layer may include nitride. In another embodiment, the data storage layer may include various materials according to a data storage method. In an example, the data storage layer may include silicon, a phase change material, or nano dots. The blocking layer may include a material capable of blocking movement of charges. In an example, the blocking layer may include oxide.

The cell plug CPL may penetrate the second cell source layer CSL2 and the third cell source layer CSL3 of the cell source structure CSS. The cell plug CPL may be connected to the second cell source layer CSL2. The cell channel layer CCL of the cell plug CPL may be in contact with the second cell source layer CSL2. The cell channel layer CCL of the cell plug CPL may be electrically connected to the second cell source layer CSL2.

The cell plug CPL may include an upper portion CPL_U and a lower portion CPL_L. The upper portion CPL_U of the cell plug CPL may penetrate an upper portion of the cell stack structure CST. The lower portion CPL_L of the cell plug CPL may penetrate a lower portion of the cell stack structure CST. A width of the upper portion CPL_U of the cell plug CPL may become smaller as the width becomes closer to the substrate 100. A width of the lower portion CPL_L of the cell plug CPL may become smaller as the width becomes closer to the substrate 100.

A dummy stack structure DST may be provided on the first dummy source structure DSS1, the second dummy source structure DSS2, and the insulating structure IST. The dummy stack structure DST may be disposed on the chip guard region CGR of the substrate 100. The dummy stack structure DST may surround the cell stack structure CST. The dummy stack structure DST may include first dummy stack layers DIL1 and second dummy stack layers DIL2, which are alternately stacked in the third direction D3. The first dummy stack layers DIL1 may include an insulating material. In an example, the first dummy stack layers DIL1 may include oxide. The second dummy stack layers DIL2 may include an insulating material different from that of the first dummy stack layers DIL1. In an example, the second dummy stack layers DIL2 may include nitride. The first dummy stack layer DIL1 may be connected to the first cell stack layer CIL1 without any boundary. In other words, the first dummy stack layer DIL1 and the first cell stack layer CIL1 may be integrally formed.

A first cell chip guard CG1 and a second cell chip guard CG2 may be provided, which penetrate the dummy stack structure DST. The first and second cell chip guards CG1 and CG2 may be disposed on the chip guard region CGR of the substrate 100. Although a case where a number of the cell chip guards CG1 and CG2 is two has been illustrated and described, the number of the cell chip guards CG1 and CG2 might not be limited thereto. In an example, the number of the cell chip guards CG1 and CG2 may be one or be three or more. The first and second cell chip guards CG1 and CG2 will be described later.

A second insulating layer 120 may be provided, which covers the cell stack structure CST and the dummy stack structure DST. The second insulating layer 120 may include an insulating material. In an example, the second insulating layer 120 may include oxide or nitride. The second insulating layer 120 may be a multi-layer including a plurality of insulating layers.

Bit line contacts BCT and bit lines BL may be provided in the second insulating layer 120. The bit line contacts BCT and the bit lines BL may be disposed on the cell region CER of the substrate 100. The bit line contact BCT may connect the cell channel layer CCL of the cell plug CPL to the bit line BL. The bit line BL may extend in the second direction D2. The bit lines BL may be spaced apart from each other in the first direction D1. The bit line contacts BCT and the bit lines BL may include a conductive material. In an example, the bit line contacts BCT and the bit lines BL may include tungsten.

A first upper chip guard UG1 and a second upper chip guard UG2 may be provided in the second insulating layer 120. The first upper chip guard UG1 and the second upper chip guard UG2 may be disposed on the chip guard region CGR of the substrate 100. Although a case where a number of the upper chip guards UG1 and UG2 is two has been illustrated and described, the number of the upper chip guards UG1 and UG2 might not be limited thereto. In an example, the number of the upper chip guards UG1 and UG2 may be one or be three or more. The first and second upper chip guards UG1 and UG2 will be described later.

Referring to FIGS. 1A to 1F, the first lower chip guard LG1 may surround the first contacts CT1, the first lines ML1, and the cell source structure CSS. The second lower chip guard LG2 may surround the first contacts CT1, the first lines ML1, the cell source structure CSS, and the first lower chip guard LG1.

The first lower chip guard LG1 may include first parts extending in the first direction D1 and second parts extending in the second direction D2. The first parts of the first lower chip guard LG1 may be spaced apart from each other in the second direction D2. The second parts of the first lower chip guard LG1 may be spaced apart from each other in the first direction D1. The first part of the first lower chip guard LG1 may be disposed on the first region RG1 of the substrate 100. The second part of the first lower chip guard LG1 may be disposed on the second region RG2 of the substrate 100. The first contacts CT1, the first lines ML1, and the cell source structure CSS may be disposed between the first parts of the first lower chip guard LG1. The first contacts CT1, the first lines ML1, and the cell source structure CSS may be disposed between the second parts of the first lower chip guard LG1. The first parts and the second parts of the first lower chip guard LG1 may be connected to each other. The first contacts CT1, the first lines ML1, and the cell source structure CSS may be surrounded by the first parts and the second parts of the first lower chip guard LG1.

The first lower chip guard LG1 may include first lower guard parts LP1 and a first penetration guard part PP1. The first lower guard parts LP1 and the first penetration guard part PP1 may be sequentially disposed along the third direction D3. The first lower guard parts LP1 and the first penetration guard part PP1 may be connected to each other.

The first penetration guard part PP1 may penetrate the first dummy source structure DSS1. A level of a top surface of the first penetration guard part PP1 may be equal to that of a top surface of the first dummy source structure DSS1. The first penetration guard part PP1 may surround the cell source structure CSS. The first lower guard parts LP1 may be disposed in the first insulating layer 110. The first lower guard parts LP1 may surround the first contacts CT1 and the first lines ML1.

Each of the first lower guard part LP1 and the first penetration guard part PP1 may include first parts extending in the first direction D1 and second parts extending in the second direction D2. The first part of each of the first lower guard part LP1 and the first penetration guard part PP1 may be disposed on the first region RG1 of the substrate 100. The second part of each of the first lower guard part LP1 and the first penetration guard part PP1 may be disposed on the second region RG2 of the substrate 100. The first parts of each of the first lower guard part LP1 and the first penetration guard part PP1 may be spaced apart from each other in the second direction D2. The second parts of each of the first lower guard part LP1 and the first penetration guard part PP1 may be spaced apart from each other in the first direction D1. The first parts and the second parts of each of the first lower guard part LP1 and the first penetration guard part PP1 may be connected to each other.

The first lower guard parts LP1 and the first penetration guard part PP1 may include a conductive material. In an example, the first lower guard parts LP1 and the first penetration guard part PP1 may include tungsten.

The second lower chip guard LG2 may include first parts extending in the first direction D1 and second parts extending in the second direction D2. The first parts of the second lower chip guard LG2 may be spaced apart from each other in the second direction D2. The second parts of the second lower chip guard LG2 may be spaced apart from each other in the first direction D1. The first part of the second lower chip guard LG2 may be disposed on the first region RG1 of the substrate 100. The second part of the second lower chip guard LG2 may be disposed on the second region RG2 of the substrate 100. The first contacts CT1, the first lines ML1, the cell source structure CSS, and the first lower chip guard LG1 may be disposed between the first parts of the second lower chip guard LG2. The first contacts CT1, the first lines ML1, the cell source structure CSS, and the first lower chip guard LG1 may be disposed between the second parts of the second lower chip guard LG2. The first contacts CT1, the first lines ML1, the cell source structure CSS, and the first lower chip guard LG1 may be surrounded by the first parts and the second parts of the second lower chip guard LG2.

The second lower chip guard LG2 may include second lower guard parts LP2 and a second penetration guard part PP2. The second lower guard parts LP2 and the second penetration guard part PP2 may be sequentially disposed along the third direction D3. The second lower guard parts LP2 and the second penetration guard part PP2 may be connected to each other.

The second penetration guard part PP2 may penetrate the second dummy source structure DSS2. A level of a top surface of the second penetration guard part PP2 may be equal to that of a top surface of the second dummy source structure DSS2. The second penetration guard part PP2 may surround the cell source structure CSS and the first penetration guard part PP1. The second lower guard parts LP2 may be disposed in the first insulating layer 110. The second lower guard parts LP2 may surround the first contacts CT1, the first lines ML1, and the first lower guard parts LP1.

Each of the second lower guard parts LP2 and the second penetration guard part PP2 may include first parts extending in the first direction D1 and second parts extending in the second direction D2. The first part of each of the second lower guard parts LP2 and the second penetration guard part PP2 may be disposed on the first region RG1 of the substrate 100. The second part of each of the second lower guard parts LP2 and the second penetration guard part PP2 may be disposed on the second region RG2 of the substrate 100. The first parts of each of the second lower guard parts LP2 and the second penetration guard part PP2 may be spaced apart from each other in the second direction D2. The second parts of each of the second lower guard parts LP2 and the second penetration guard part PP2 may be spaced apart from each other in the first direction D1. The first parts and the second parts of each of the second lower guard parts LP2 and the second penetration guard part PP2 may be connected to each other.

The second lower guard parts LP2 and the second penetration guard part PP2 may include a conductive material. In an example, the second lower guard parts LP2 and the second penetration guard part PP2 may include tungsten.

The first cell chip guard CG1 may surround the cell stack structure CST and the cell plugs CPL. The second cell chip guard CG2 may surround the cell stack structure CST, the cell plugs CPL, and the first cell chip guard CG1.

The first cell chip guard CG1 may include first cell extension parts CE1 and second cell extension parts CE2. The first cell extension parts CE1 may extend in the first direction D1. The second cell extension parts CE2 may extend in the second direction D2. The first cell extension parts CE1 may be spaced apart from each other in the second direction D2. The second cell extension parts CE2 may be spaced apart from each other in the first direction D1. The cell stack structure CST and the cell plugs CPL may be disposed between the first cell extension parts CE1. The cell stack structure CST and the cell plugs CPL may be disposed between the second cell extension parts CE2. Two first cell extension parts CE1 may be connected to one second cell extension part CE2. Two second cell extension parts CE2 may be connected to one first cell extension part CE1. Each of the first cell extension parts CE1 may be disposed on each of the first regions RG1 of the substrate 100. Each of the second cell extension parts CE2 may be disposed on each of the second regions RG2 of the substrate 100. The cell stack structure CST and the cell plugs CPL may be surrounded by the first cell extension parts CE1 and the second cell extension parts CE2.

The first cell chip guard CG1 may include a first guard semiconductor layer GSE1, a first guard insulating layer GIL1, and a first guard filling layer GFI1. The first guard semiconductor layer GSE1 may be disposed in the first guard insulating layer GIL1. The first guard filling layer GFI1 may be disposed in the first guard semiconductor layer GSE1. The first guard semiconductor layer GSE1 may cover a sidewall, a bottom surface, and a top surface of the first guard filling layer GFI1. The first guard insulating layer GIL1 may cover a sidewall and a bottom surface of the first guard semiconductor layer GSE1.

The first cell chip guard CG1 may penetrate the dummy stack structure DST while extending in the third direction D3. Each of the first guard semiconductor layer GSE1, the first guard insulating layer GIL1, and the first guard filling layer GFI1 may penetrate the dummy stack structure DST while extending in the third direction D3. Each of the first guard semiconductor layer GSE1, the first guard insulating layer GIL1, and the first guard filling layer GFI1 may surround the cell stack structure CST and the cell plugs CPL. A portion of the first cell chip guard CG1 may be disposed at the same level as a portion of the first lower chip guard LG1.

Each of the first guard semiconductor layer GSE1, the first guard insulating layer GIL1, and the first guard filling layer GFI1 may include first parts extending in the first direction D1 and second parts extending in the second direction D2. The first part of each of the first guard semiconductor layer GSE1, the first guard insulating layer GIL1, and the first guard filling layer GFI1 may be disposed on the first region RG1 of the substrate 100. The second part of each of the first guard semiconductor layer GSE1, the first guard insulating layer GIL1, and the first guard filling layer GFI1 may be disposed on the second region RG2 of the substrate 100. The first parts of each of the first guard semiconductor layer GSE1, the first guard insulating layer GIL1, and the first guard filling layer GFI1 may be spaced apart from each other in the second direction D2. The second parts of each of the first guard semiconductor layer GSE1, the first guard insulating layer GIL1, and the first guard filling layer GFI1 may be spaced apart from each other in the first direction D1. The first parts and the second parts of each of the first guard semiconductor layer GSE1, the first guard insulating layer GIL1, and the first guard filling layer GFI1 may be connected to each other.

The second cell chip guard CG2 may include third cell extension parts CE3 and fourth cell extension parts CE4. The third cell extension parts CE3 may extend in the first direction D1. The fourth cell extension parts CE4 may extend in the second direction D2. The third cell extension parts CE3 may be spaced apart from each other in the second direction D2. The fourth cell extension parts CE4 may be spaced apart from each other in the first direction D1. The cell stack structure CST, the cell plugs CPL, and the first cell chip guard CG1 may be disposed between the third cell extension parts CE3. The cell stack structure CST, the cell plugs CPL, and the first cell chip guard CG1 may be disposed between the fourth cell extension parts CE4. Two third cell extension parts CE3 may be connected to one fourth cell extension part CE4. Two fourth cell extension parts CE4 may be connected to one third cell extension part CE3. Each of the third cell extension parts CE3 may be disposed on each of the first regions RG1 of the substrate 100. Each of the fourth cell extension parts CE4 may be disposed on each of the second regions RG2 of the substrate 100. The cell stack structure CST, the cell plugs CPL, and the first cell chip guard CG1 may be surrounded by the third cell extension parts CE3 and the fourth cell extension parts CE4.

The second cell chip guard CG2 may include a second guard semiconductor layer GSE2, a second guard insulating layer GIL2, and a second guard filling layer GFI2. The second guard semiconductor layer GSE2 may be disposed in the second guard insulating layer GIL2. The second guard filling layer GFI2 may be disposed in the second guard semiconductor layer GSE2. The second guard semiconductor layer GSE2 may cover a sidewall, a bottom surface, and a top surface of the second guard filling layer GFI2. The second guard insulating layer GIL2 may cover a sidewall and a bottom surface of the second guard semiconductor layer GSE2.

The second cell chip guard CG2 may penetrate the dummy stack structure DST while extending in the third direction D3. Each of the second guard semiconductor layer GSE2, the second guard insulating layer GIL2, and the second guard filling layer GFI2 may penetrate the dummy stack structure DST while extending in the third direction D3. Each of the second guard semiconductor layer GSE2, the second guard insulating layer GIL2, and the second guard filling layer GFI2 may surround the cell stack structure CST, the cell plugs CPL, and the first cell chip guard CG1. A portion of the second cell chip guard CG2 may be disposed at the same level as a portion of the second lower chip guard LG2.

Each of the second guard semiconductor layer GSE2, the second guard insulating layer GIL2, and the second guard filling layer GFI2 may include first parts extending in the first direction D1 and second parts extending in the second direction D2. The first part of each of the second guard semiconductor layer GSE2, the second guard insulating layer GIL2, and the second guard filling layer GFI2 may be disposed on the first region RG1 of the substrate 100. The second part of each of the second guard semiconductor layer GSE2, the second guard insulating layer GIL2, and the second guard filling layer GFI2 may be disposed on the second region RG2 of the substrate 100. The first parts of each of the second guard semiconductor layer GSE2, the second guard insulating layer GIL2, and the second guard filling layer GFI2 may be spaced apart from each other in the second direction D2. The second parts of each of the second guard semiconductor layer GSE2, the second guard insulating layer GIL2, and the second guard filling layer GFI2 may be spaced apart from each other in the first direction D1. The first parts and the second parts of each of the second guard semiconductor layer GSE2, the second guard insulating layer GIL2, and the second guard filling layer GFI2 may be connected to each other.

The cell channel layer CCL, the first guard semiconductor layer GSE1, and the second guard semiconductor layer GSE2 may include the same material. In an example, the cell channel layer CCL, the first guard semiconductor layer GSE1, and the second guard semiconductor layer GSE2 may include poly-silicon. The cell memory layer CML, the first guard insulating layer GIL1, and the second guard insulating layer GIL2 may include the same material. The first guard insulating layer GIL1 and the second guard insulating layer GIL2 may include a first guard layer including the same material as the tunnel insulating layer of the cell memory layer CML, a second guard layer including the same material as the data storage layer of the cell memory layer CML, and a third guard layer including the same material as the blocking layer of the cell memory layer CML. The cell filling layer CFI, the first guard filling layer GFI1, and the second guard filling layer GFI2 may include the same material. In an example, the cell filling layer CFI, the first guard filling layer GFI1, and the second guard filling layer GFI2 may include oxide.

The first cell chip guard CG1 and the second cell chip guard CG2 may be disposed at the same level as the cell plugs CPL. A portion of the first cell chip guard CG1, a portion of the second cell chip guard CG2, an upper portion of the first penetration guard part PP1, and an upper portion of the second penetration guard part PP2 may be disposed at the same level.

A portion of the first cell chip guard CG1 may be disposed in the first dummy source structure DSS1. The first cell chip guard CG1 may penetrate the first and second etch stop layers ESL1 and ESL2 and the second and third dummy source layers DSL2 and DSL3 of the first dummy source structure DSS1.

A portion of the second cell chip guard CG2 may be disposed in the second dummy source structure DSS2. The second cell chip guard CG2 may penetrate the first and second etch stop layers ESL1 and ESL2 and the second and third dummy source layers DSL2 and DSL3 of the second dummy source structure DSS2.

The first cell chip guard CG1 may include an upper portion CG1_U and a lower portion CG1_L. The upper portion CG1_U of the first cell chip guard CG1 may penetrate an upper portion of the dummy stack structure DST. The lower portion CG1_L of the first cell chip guard CG1 may penetrate a lower portion of the dummy stack structure DST. A width of the upper portion CG1_U of the first cell chip guard CG1 may become smaller as the width gets closer to the substrate 100. A width of the lower portion CG1_L of the first cell chip guard CG1 may become smaller as the width gets closer to the substrate 100. A minimum width of the upper portion CG1_U of the first cell chip guard CG1 may be smaller than a maximum width of the lower portion CG1_L of the first cell chip guard CG1. In an embodiment, a width of the upper portion CG1_U of the first cell chip guard CG1 becomes smaller as the width becomes closer to the lower portion CG1_L of the first cell chip guard CG1. In an embodiment, a width of the lower portion CG1_L of the first cell chip guard CG1 becomes larger as the width becomes closer to the upper portion CG1_U of the first cell chip guard CG1.

The second cell chip guard CG2 may include an upper portion CG2_U and a lower portion CG2_L. The upper portion CG2_U of the second cell chip guard CG2 may penetrate an upper portion of the dummy stack structure DST. The lower portion CG2_L of the second cell chip guard CG2 may penetrate a lower portion of the dummy stack structure DST. A width of the upper portion CG2_U of the second cell chip guard CG2 may become smaller as the width gets closer to the substrate 100. A width of the lower portion CG2_L of the second cell chip guard CG2 may become smaller as the width gets closer to the substrate 100. A minimum width of the upper portion CG2_U of the second cell chip guard CG2 may be smaller than a maximum width of the lower portion CG2_L of the second cell chip guard CG2.

The first upper chip guard UG1 may surround the bit line contacts BCT and the bit lines BL. The second upper chip guard UG2 may surround the bit line contacts BCT, the bit lines BL, and the first upper chip guard UG1. The first upper chip guard UG1 may be connected to the first cell chip guard CG1. The second upper chip guard UG2 may be connected to the second cell chip guard CG2.

The first upper chip guard UG1 may include first parts extending in the first direction D1 and second parts extending in the second direction D2. The first parts of the first upper chip guard UG1 may be spaced apart from each other in the second direction D2. The second parts of the first upper chip guard UG1 may be spaced apart from each other in the first direction D1. The first part of the first upper chip guard UG1 may be disposed on the first region RG1 of the substrate 100. The second part of the first upper chip guard UG1 may be disposed on the second region RG2 of the substrate 100. The bit line contacts BCT and the bit lines BL may be disposed between the first parts of the first upper chip guard UG1. The bit line contacts BCT and the bit lines BL may be disposed between the second parts of the first upper chip guard UG1. The first parts and the second parts of the first upper chip guard UG1 may be connected to each other.

The first upper chip guard UG1 may include first upper guard parts UP1. The first upper guard parts UP1 may be sequentially disposed along the third direction D3. The first upper guard parts UP1 may be connected to each other.

The first upper guard parts UP1 may be disposed in the second insulating layer 120. The first upper guard parts UP1 may surround the bit line contacts BCT and the bit lines BL.

Each of the first upper guard parts UP1 may include first parts extending in the first direction D1 and second parts extending in the second direction D2. The first part of each of the first upper guard parts UP1 may be disposed on the first region RG1 of the substrate 100. The second part of each of the first upper guard parts UP1 may be disposed on the second region RG2 of the substrate 100. The first parts of each of the first upper guard parts UP1 may be spaced apart from each other in the second direction D2. The second parts of each of the first upper guard parts UP1 may be spaced apart from each other in the first direction D1. The first parts and the second parts of each of the first upper guard parts UP1 may be connected to each other.

The first upper guard parts UP1 may include a conductive material. In an example, the first upper guard parts UP1 may include tungsten.

The second upper chip guard UG2 may include first parts extending in the first direction D1 and second parts extending in the second direction D2. The first parts of the second upper chip guard UG2 may be spaced apart from each other in the second direction D2. The second parts of the second upper chip guard UG2 may be spaced apart from each other in the first direction D1. The first part of the second upper chip guard UG2 may be disposed on the first region RG1 of the substrate 100. The second part of the second upper chip guard UG2 may be disposed on the second region RG2 of the substrate 100. The bit line contacts BCT, the bit lines BL, and the first upper chip guard UG1 may be disposed between the first parts of the second upper chip guard UG2. The bit line contacts BCT, the bit lines BL, and the first upper chip guard UG1 may be disposed between the second parts of the second upper chip guard UG2. The first parts and the second parts of the second upper chip guard UG2 may be connected to each other.

The second upper chip guard UG2 may include second upper guard parts UP2. The second upper guard parts UP2 may be sequentially disposed along the third direction D3. The second upper guard parts UP2 may be connected to each other.

The second upper guard parts UP2 may be disposed in the second insulating layer 120. The second upper guard parts UP2 may surround the bit line contacts BCT, the bit lines BL, and the first upper chip guard UG1.

Each of the second upper guard parts UP2 may include first parts extending in the first direction D1 and second parts extending in the second direction D2. The first part of each of the second upper guard parts UP2 may be disposed on the first region RG1 of the substrate 100. The second part of each of the second upper guard parts UP2 may be disposed on the second region RG2 of the substrate 100. The first parts of each of the second upper guard parts UP2 may be spaced apart from each other in the second direction D2. The second parts of each of the second upper guard parts UP2 may be spaced apart from each other in the first direction D1. The first parts and the second parts of each of the second upper guard parts UP2 may be connected to each other.

The second upper guard parts UP2 may include a conductive material. In an example, the second upper guard parts UP2 may include tungsten.

In the cell chip guards CG1 and CG2 of the semiconductor device in accordance with the embodiments of the present disclosure, the guard filling layers GFI1 and GFI2 may be substantially filled or completely filled in spaces in the guard semiconductor layers GSE1 and GSE2. Accordingly, a void or crack can be prevented or mitigated from being formed in the cell chip guards CG1 and CG2.

The cell chip guards CG1 and CG2 of the semiconductor device in accordance with the embodiments of the present disclosure are formed to be divided into the upper portions CG1_U and CG2_U and the lower portions CG1_L and CG2_L. Accordingly, widths of the cell chip guards CG1 and CG2 can be relatively small as opposed to cell chip guards that are not divided into the upper and lower portions, and a void or crack can be prevented from being formed in the cell chip guards CG1 and CG2 that have the relatively small widths.

FIGS. 2A, 2B, 3A, 3B, 4A, and 4B are sectional views illustrating a manufacturing method of the semiconductor device in accordance with embodiments of the present disclosure. Hereinafter, descriptions of portions overlapping with those described above will be omitted.

Figure 2A:
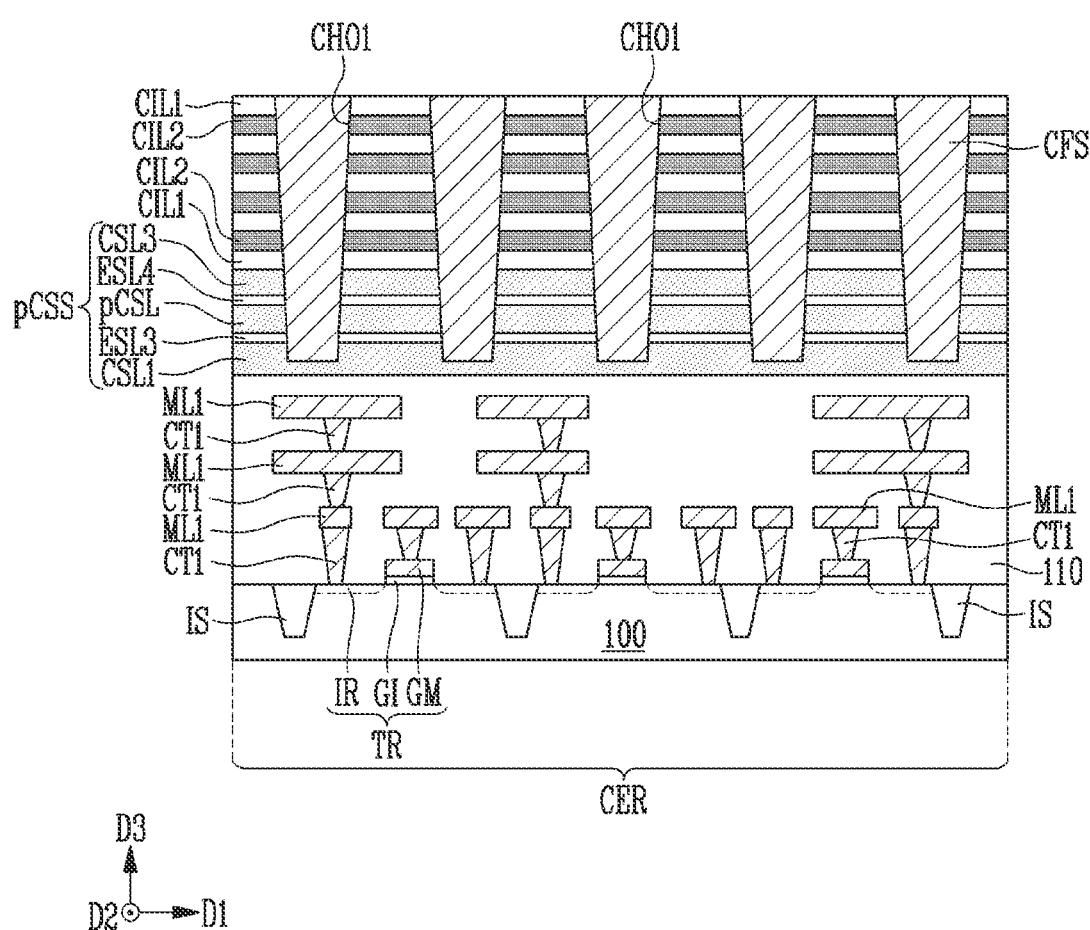
Figure 2B:
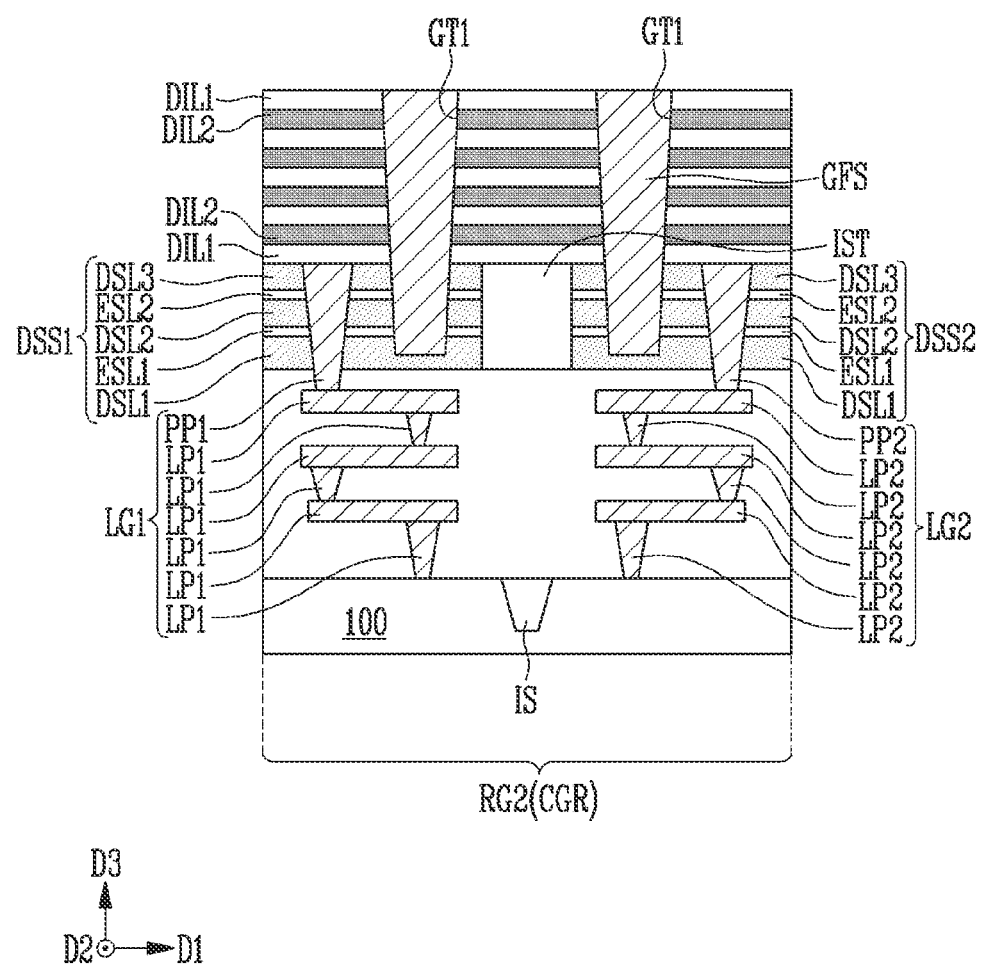

Referring to FIGS. 2A and 2B, a substrate 100 may be formed. Subsequently, isolation layers IS and peripheral transistors TR may be formed on the substrate 100.

A first insulating layer 110 may be formed, which covers the substrate 100 and the peripheral transistors TR. While the first insulating layer 100 is formed, first contacts CT1, first lines ML1, a first lower chip guard LG1, and a second lower chip guard LG2 may be formed.

A preliminary cell source structure pCSS may be formed on the first insulating layer 110. The preliminary cell source structure pCSS may include a first cell source layer CSL1, a third etch stop layer ESL3, a preliminary cell source layer pCSL, a fourth etch stop layer ESL4, and a third cell source layer CSL3, which are sequentially stacked in the third direction D3. The preliminary cell source structure pCSS may be formed on a cell region CER of the substrate 100.

First and second dummy source structures DST1 and DST2 may be formed on the first insulating layer 110. An insulating structure IST may be formed on the first insulating layer 110.

First cell stack layers CIL1 and second cell stack layers CIL2 may be alternately formed on the preliminary cell source structure pCSS. The second cell stack layers CIL2 may include an insulating material different from that of the first cell stack layers CIL1. In an example, the second cell stack layers CIL2 may include nitride. The first cell stack layers CIL1 and the second cell stack layers CIL2 may be formed on the cell region CER of the substrate 100.

First dummy stack layers DIL1 and second dummy stack layers DIL2 may be alternately formed on the first and second dummy source structures DST1 and DST2. The first dummy stack layers DIL1 and the second dummy stack layers DIL2 may be formed on a chip guard region CGR of the substrate 100.

The first cell stack layer CIL1 and the first dummy stack layer DIL1 may be simultaneously formed. The first cell stack layer CIL1 and the first dummy stack layer DIL1 may be continuously formed without any boundary. The second cell stack layer CIL2 and the second dummy stack layer DIL2 may be simultaneously formed. The second cell stack layer CIL2 and the second dummy stack layer DIL2 may be continuously formed without any boundary.

Cell sacrificial structures CFS may be formed, which penetrate the first cell stack layers CiL1 and the second cell stack layers CIL2. The forming of the cell sacrificial structures CFS may include forming first cell holes CHO1 penetrating the first cell stack layers CIL1 and the second cell stack layers CIL2 and forming the cell sacrificial structures CFS in the first cell holes CHO1. The cell sacrificial structures CFS may be formed on the cell region CER of the substrate 100. The cell sacrificial structures CFS may have a cylindrical shape. The cell sacrificial structures CFS may include a material having an etch selectivity with respect to that which the first cell stack layers CIL1 and the second cell stack layers CIL2 include. In an example, the cell sacrificial structures CFS may include tungsten.

Guard sacrificial structures GFS may be formed, which penetrate the first dummy stack layers DIL1 and the second dummy stack layers DIL2. The forming of the guard sacrificial structure GFS may include forming first guard trenches GT1 penetrating the first dummy stack layers DIL1 and the second dummy stack layers DIL2 and forming the guard sacrificial structures GFS in the first guard trenches GT1. The first guard trenches GT1 may surround the first cell holes CHO1. The guard sacrificial structures GFS may be formed on the chip guard region CGR of the substrate 100. The guard sacrificial structures GFS may be simultaneously formed with the cell sacrificial structures CFS. The guard sacrificial structures GFS may surround the cell sacrificial structures CFS. The guard sacrificial structures GFS may include the same material as the cell sacrificial structures CFS. In an example, the guard sacrificial structures GFS may include tungsten.

Figure 3A:
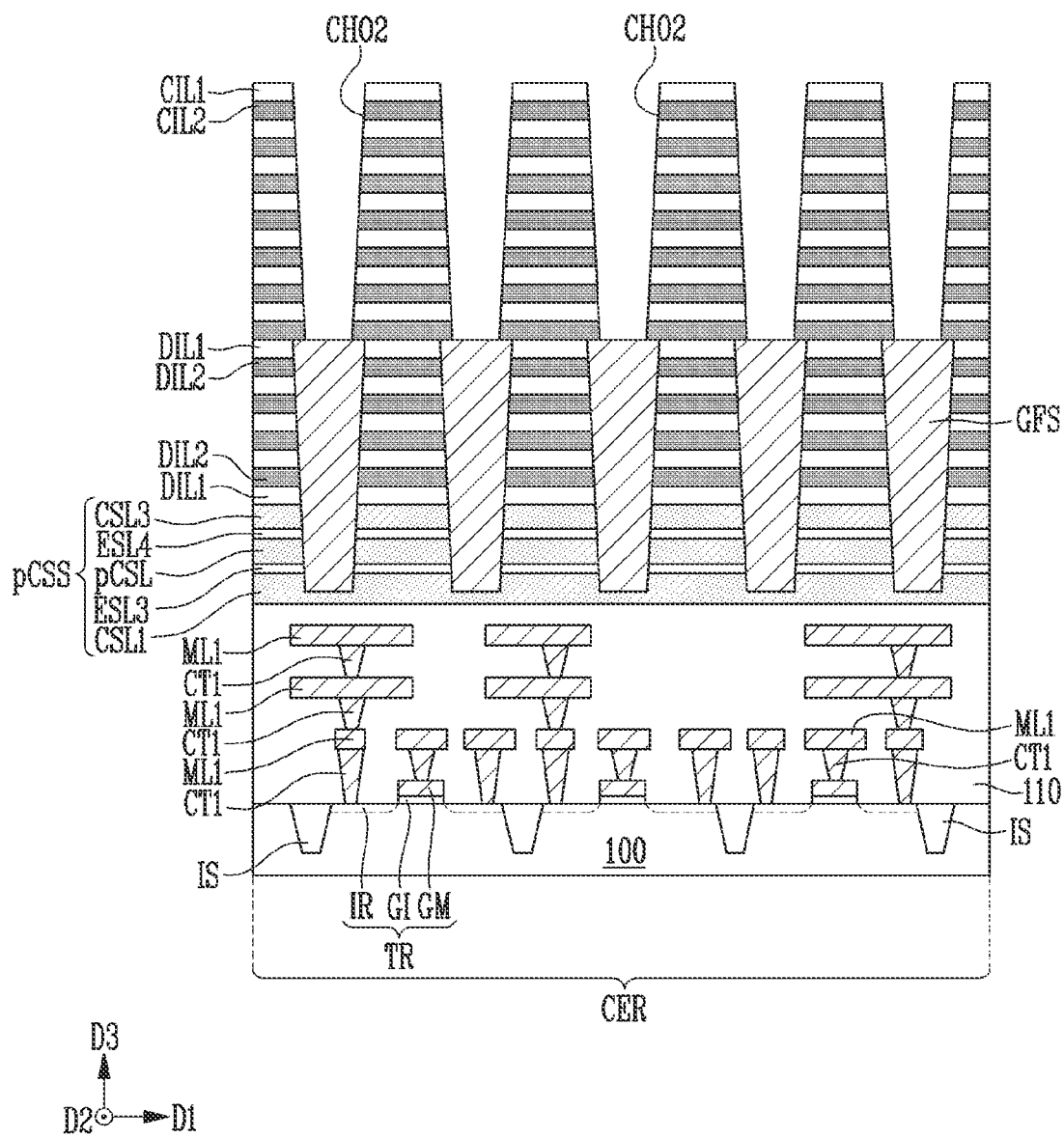
Figure 3B:
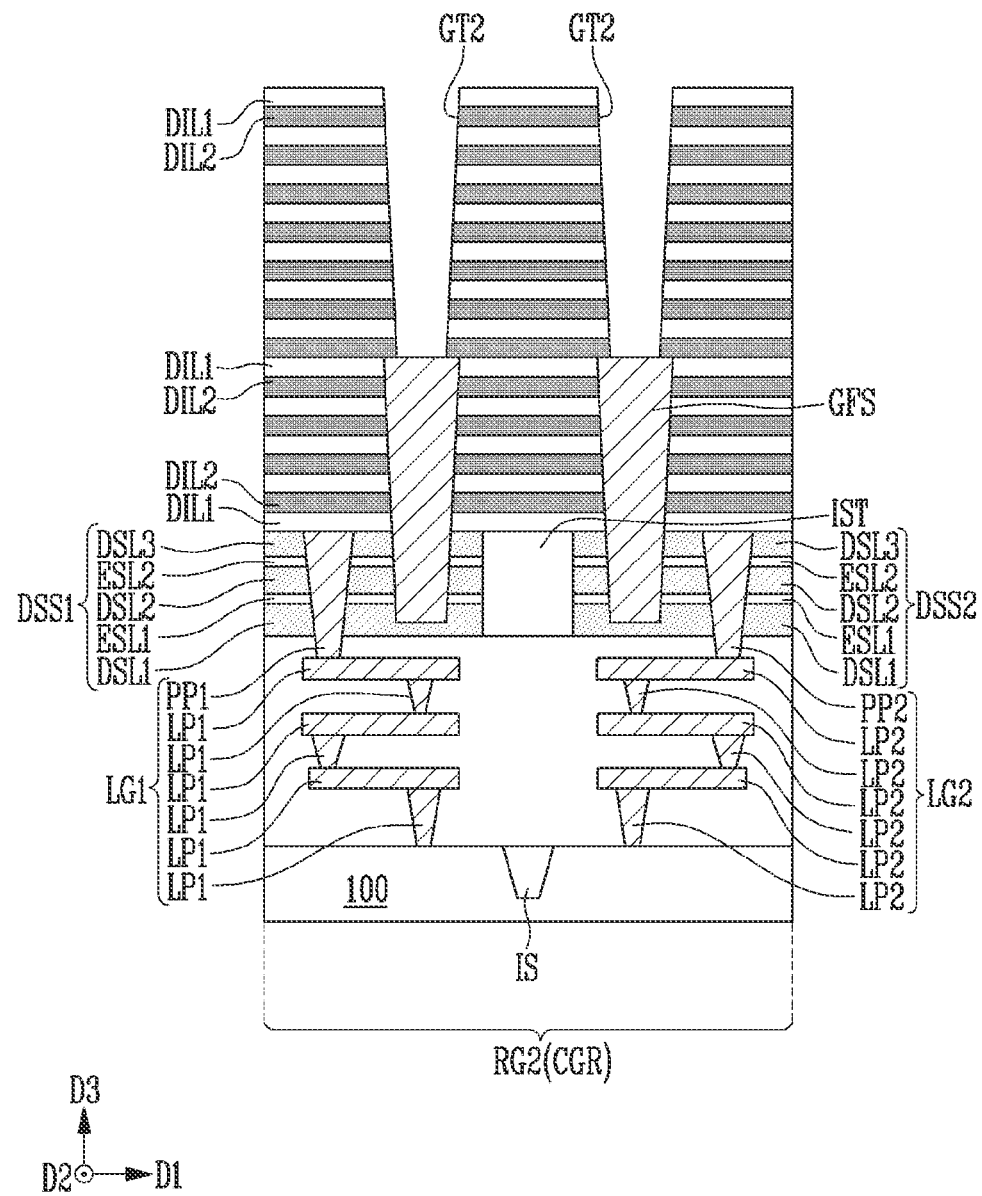

Referring to FIGS. 3A and 3B, first cell stack layers CIL1 and second cell stack layers CIL2 may be alternately formed on the cell sacrificial structures CFS.

Subsequently, second cell holes CHO2 may be formed, which penetrate the first cell stack layers CIL1 and the second cell stack layers CIL2 on the cell sacrificial structures CFS. When the second cell holes CHO2 are formed, top surfaces of the cell sacrificial structures CFS may be exposed.

First dummy stack layers DIL1 and second dummy stack layers DIL2 may be alternately formed on the guard sacrificial structures GFS.

Subsequently, second guard trenches GT2 may be formed, which penetrate the first dummy stack layers DIL1 and the second dummy stack layers DIL2 on the guard sacrificial structures GFS. When the second guard trenches GT2 are formed, top surfaces of the guard sacrificial structures GFS may be exposed. The second guard trenches GT2 may surround the second cell holes CHO2.

Figure 4A:
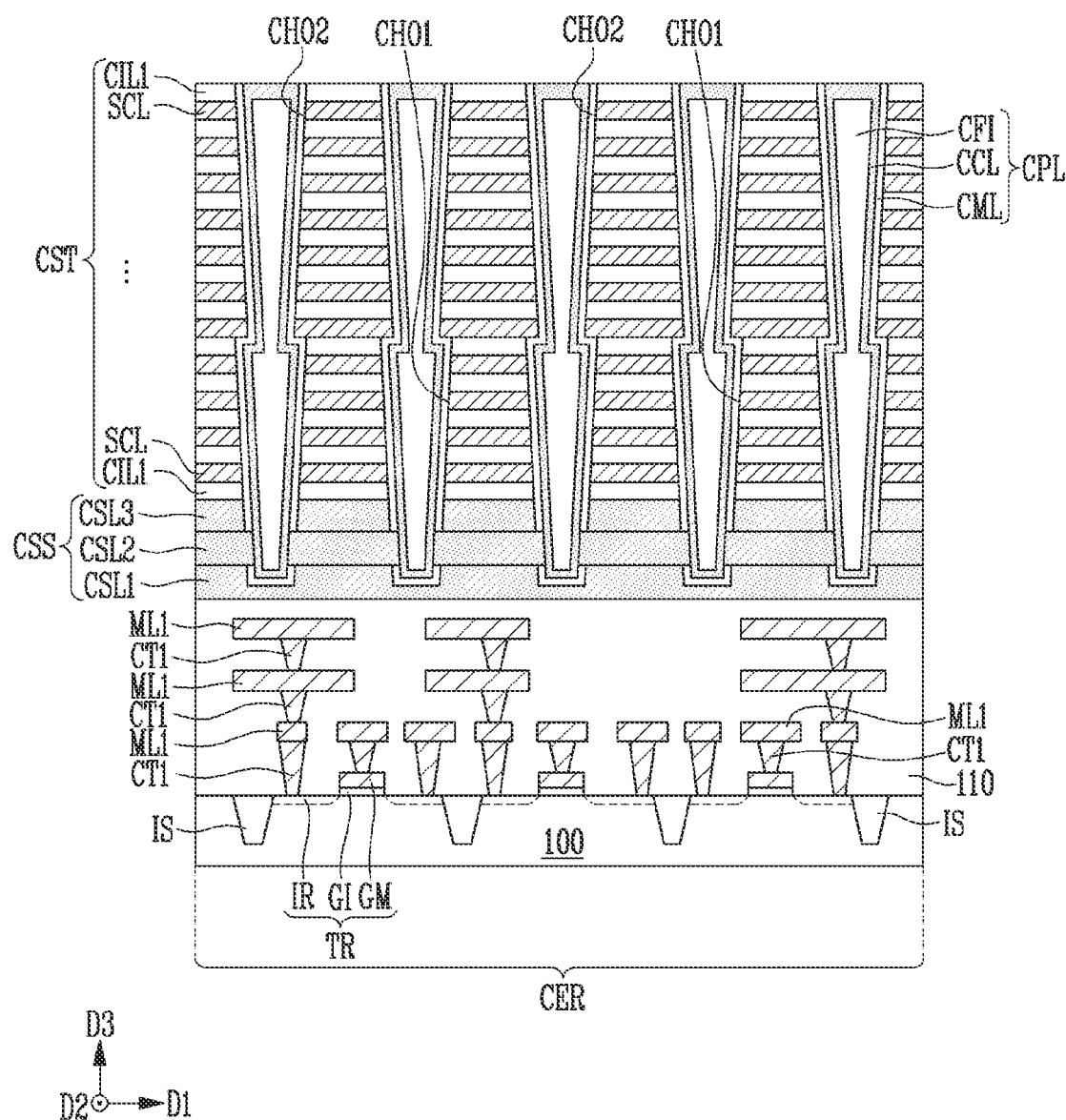
Figure 4B:
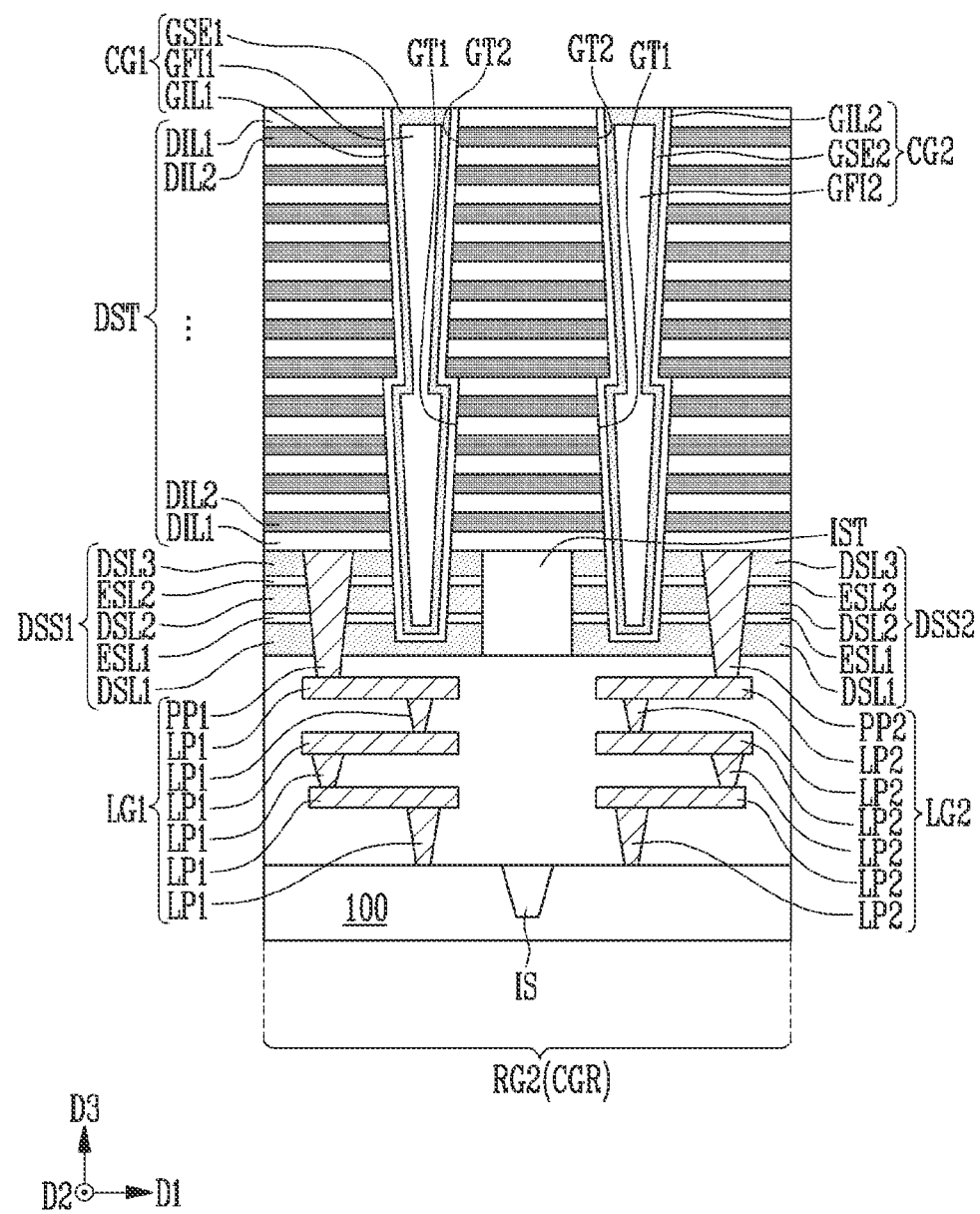

Referring to FIGS. 4A and 4B, cell plugs CPL may be formed. The forming of the cell plugs CPL may include removing the cell sacrificial structures CFS through the second cell holes CHO2 and forming the cell plugs CPL in the first cell holes CHO1 and the second cell holes CHO2.

First and second cell chip guards CG1 and CG2 may be formed. The forming of the first and second cell chip guards CG1 and CG2 may include removing the guard sacrificial structures GFS through the second guard trenches CT2 and forming the first and second cell chip guards CG1 and CG2 in the first and second guard trenches GT1 and GT2.

The cell plugs CPL, the first cell chip guard CG1, and the second cell chip guard CG2 may be simultaneously formed. The forming of the cell plugs CPL, the first cell chip guard CG1, and the second cell chip guard CG2 may include forming a first material layer covering surfaces of the first and second cell holes CHO1 and CHO2 and the first and second guard trenches GT1 and GT2, forming a second material layer covering a surface of the first material layer, and forming a third material layer covering a surface of the second material layer. The first material layer may be a multi-layer. In an example, the first material layer may include a plurality of insulating layers. The second material layer may include a semiconductor material. Through a subsequent process, the first material layer may be isolated into a cell memory layer CML, a first guard insulating layer GIL1, and a second guard insulating layer GIL2, the second material layer may be isolated into a cell channel layer CCL, a first guard semiconductor layer GSE1, and a second guard semiconductor layer GSE2, and the third material layer may be isolated into a cell filling layer CFI, a first guard filling layer GFI1, and a second guard filling layer GFI2.

A cell source structure CSS and stack conductive layers SCL may be formed. The forming of the cell source structure CSS and the stack conductive layers SCL may include forming a slit penetrating a cell stack structure CST, removing the preliminary source layer pCSL, the third etch stop layer ESL3, and the fourth etch stop layer ESL4 through the slit, forming a second cell source layer CSL2 in an empty space in which the preliminary source layer pCSL, the third etch stop layer ESL3, and the fourth etch stop layer ESL4 are removed, removing the second cell stack layers CIL2 through the slit, and forming the stack conductive layers SCL in empty spaces in which the second cell stack layers CIL2 are removed. When the second cell source layer CSL2 is formed, the preliminary cell source structure pCSS may be defined as the cell source structure CSS.

A second insulating layer 120 may be formed, which covers the cell plugs CPL, the cell stack structure CST, the first and second cell chip guards CG1 and CG2, and a dummy stack structure DST (see FIGS. 1B to 1D). Bit line contact BCT, bit lines BL, a first upper chip guard UG1, and a second upper chip guard UG2 may be formed in the second insulating layer 120 (see FIGS. 1B to 1D).

In the manufacturing method of the semiconductor device in accordance with the embodiments of the present disclosure, the cell chip guards CG1 and CG2 are formed by using the first guard trench GT1 and the second guard trench GT2. Accordingly, widths of the first and second guard trenches GT1 and GT2 can be relatively small, and a void or crack can be mitigated or prevented from being formed in the cell chip guards CG1 and CG2.

In the manufacturing method of the semiconductor device in accordance with the embodiments of the present disclosure, the cell chip guards CG1 and CG2 are simultaneously formed with the cell plug CPL. Accordingly, the manufacturing cost and manufacturing time of the semiconductor device can be minimized.

FIG. 5A is a plan view of a semiconductor device in accordance with embodiments of the present disclosure. For ease of description, FIG. 5A is shown without bit lines BL, bit line contacts BCT, a second insulating layer 120, and the first and second upper chip guards UG1 and UG2. FIG. 5B is a sectional view taken along line A2-A2' shown in FIG. 5A. FIG. 5C is a sectional view taken along line B2-B2' shown in FIG. 5A. FIG. 5D is a perspective view illustrating a guard plug and an upper chip guard of the semiconductor device in accordance with the embodiments shown in FIGS. 5A to 5C. Hereinafter, descriptions of portions overlapping with those described above will be omitted.

Referring to FIGS. 5A to 5D, a dummy source structure DSS may be provided on a first insulating layer 110. The dummy source structure DSS may be provided on a chip guard region CGR. The dummy source structure DSS may surround a cell source structure CSS.

The dummy source structure DSS may include a first dummy source layer DSL1, a first etch stop layer ESL1, a second dummy source layer DSL2, a second etch stop layer ESL2, and a third dummy source layer DSL3, which are sequentially stacked in the third direction D3.

A first lower chip guard LG1 may be provided in the first insulating layer 110 and the dummy source structure DSS. A second lower chip guard LG2 may be provided in the first insulating layer 110 and the dummy source structure DSS.

Guard plugs GPL may be provided, which penetrate a dummy stack structure DST. Guard plugs GPL may extend in the third direction D3. The guard plugs GPL may have a cylindrical shape. The guard plugs GPL may be disposed on the chip guard region CGR of a substrate 100. The guard plugs GPL may be disposed on first regions RG1 and second regions RG2 of the substrate 100. The guard plugs GPL may surround cell plugs CPL and a cell stack structure CST. From the viewpoint of a plane shown in FIG. 5A, the cell stack structure CST and the cell plugs CPL may be disposed in a space surrounded by the guard plugs GPL. The guard plugs GPL may be used as a chip guard of the semiconductor device.

Each of the guard plugs GPL may include a plug filling layer PFI, a plug semiconductor layer PSE surrounding the pug filling layer PFI, and a plug insulating layer PIL surrounding the plugs semiconductor layer PSE. The plug filling layer PFI, the plug semiconductor layer PSE, and the plug insulating layer PIL may penetrate the dummy stack structure DST while extending in the third direction D3.

The plugs filling layer PFI may include the same material as a cell filling layer CFI. In an example, the plug filling layer PFI may include oxide. The plug semiconductor layer PSE may include the same material as a cell channel layer CCL. In an example, the plug semiconductor layer PSE may include poly-silicon. The plug insulating layer PIL may include the same material as a cell memory layer CML. The plug insulating layer PIL may include a first plug layer including the same material as a tunnel insulating layer of the cell memory layer CML, a second plug layer including the same material as a data storage layer of the cell memory layer CML, and a third plug layer including the same material as the blocking layer of the cell memory layer CML.

The guard plug GPL may include an upper portion GPL_U and a lower portion GPL_L The upper portion GPL_U of the guard plug GPL may penetrate an upper portion of the dummy stack structure DST. The lower portion GPL_L of the guard plug GPL may penetrate a lower portion of the dummy stack structure DST. A width of the upper portion GPL_U of the guard plug GPL may become smaller as the width becomes closer to the substrate 100. A width of the lower portion GPL_L of the guard plug GPL may become smaller as the width becomes closer to the substrate 100. A minimum width of the upper portion GPL_U of the guard plug GPL may be smaller than a maximum width of the lower portion GPL_L of the guard plug GPL.

A distance between the guard plugs GPL may be equal to that between the cell plugs CPL or be greater than that between the cell plugs CPL. In an example, a distance between the guard plugs GPL in the first direction D1 may be equal to that between the cell plugs CPL in the first direction D1 or be greater than that between the cell plugs GPL in the first direction D1.

A first upper chip guard UG1 and a second upper chip guard UG2 may be provided on the guard plugs GPL. Each of the first upper chip guard UG1 and the second upper chip guard UG2 may overlap with a plurality of guard plugs GPL. In an example each of the first upper chip guard UG1 and the second upper chip guard UG2 may overlap with a plurality of guard plugs GPL in the third direction D3.

FIGS. 6, 7, and 8 are sectional views illustrating a manufacturing method of the semiconductor device in accordance with embodiments of the present disclosure.

Hereinafter, descriptions of portion overlapping with those described above will be omitted.

Referring to FIG. 6, a dummy source structure DSS may be formed on a first insulating layer 110. The dummy source structure DSS may be formed on a chip guard region CGR of a substrate 100.

First dummy stack layers DIL1 and second dummy stack layers DIL2 may be alternately formed on the dummy source structure DSS. The first dummy stack layers DIL1 and the second dummy stack layers DIL2 may be formed on the chip guard region CGR.

Plug sacrificial structures PFS may be formed, which penetrate the first dummy stack layers DIL1 and the second dummy stack layers DIL2. The plug sacrificial structures PFS may have a cylindrical shape. The forming of the plug sacrificial structures PFS may include forming first guard holes GHO1 penetrating the first dummy stack layers DIL1 and the second dummy stack layers DIL2 and forming the plug sacrificial structures PFS in the first guard holes GHO1. The first guard holes GHO1 may surround first cell holes.

Referring to FIG. 7, first dummy stack layers DIL1 and second dummy stack layers DIL2 may be formed on the plug sacrificial structures PFS.

Subsequently, second guard holes GHO2 may be formed, which penetrate the first dummy stack layers DIL1 and the second dummy stack layers DIL2 on the plug sacrificial structures PFS. When the second guard holes GHO2 are formed, top surfaces of the plug sacrificial structures PFS may be exposed. The second guard holes GHO2 may surround second cell holes.

Referring to FIG. 8, guard plugs GPL may be formed. The forming of the guard plugs GPL may include removing the plug sacrificial structures PFS through the second guard holes GHO2 and forming the guard plugs GPL in the first guard holes GHO1 and the second guard holes GHO2.

The forming of cell plugs and the guard plugs GPL may include forming a first material layer covering surfaces of the first and second cell holes and the first and second guard holes GHO1 and GHO2, forming a second material layer covering a surface of the first material layer, and forming a third material layer covering a surface of the second material layer. Through a subsequent process, the first material layer may be isolated into a cell memory layer and a plug insulating layer PIL, the second material layer may be isolated into a cell channel layer and a plug semiconductor layer PSE, and the third material layer may be isolated into a cell filling layer and a plug filling layer PFI.

FIG. 9 is a block diagram illustrating a configuration of a memory system in accordance with an embodiment of the present disclosure.

Referring to FIG. 9, the memory system 1100 in accordance with the embodiment of the present disclosure includes a memory device 1120 and a memory controller 1110.

The memory device 1120 may include the semiconductor devices in accordance with the embodiments of the present disclosure. The memory device 1120 may be a multi-chip package configured with a plurality of flash memory chips.

The memory controller 1110 is configured to control the memory device 1120, and may include a Static Random Access Memory (SRAM) 1111, a Central Processing Unit (CPU) 1112, a host interface 1113, an Error Correction Block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The Error Correction Block 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

FIG. 10 is a block diagram illustrating a configuration of a computing system in accordance with an embodiment of the present disclosure.

Referring to FIG. 10, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211, which are similar to those described with reference to FIG. 9.

In the semiconductor device in accordance with the present disclosure, a cell chip guard is formed to be divided into an upper portion and a lower portion, so that a void or crack can be mitigated or prevented from being formed in the cell chip guard, thereby improving the operational reliability of the semiconductor device.

The examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. Various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor device comprising:
    a cell stack structure including first cell stack layers and stack conductive layers, which are alternately stacked;
    a cell plug penetrating the cell stack structure;
    a cell chip guard surrounding the cell stack structure and the cell plug;
    a dummy source structure connected to the cell chip guard; and
    a penetration guard part penetrating the dummy source structure,
    wherein the cell chip guard includes a guard semiconductor layer and a guard insulating layer covering a sidewall of the guard semiconductor layer,
    wherein a top surface of the penetration guard part is disposed at substantially the same level as a top surface of the dummy source structure, and
    wherein a portion of the cell chip guard is disposed in the dummy source structure and spaced apart from the penetration guard part.

2. The semiconductor device of claim 1, wherein the cell chip guard further includes a guard filling layer in the guard semiconductor layer.

3. The semiconductor device of claim 1, wherein the stack conductive layers and the first cell stack layers are alternately stacked in a first direction, and
    wherein the cell chip guard includes first cell extension parts extending in a second direction intersecting the first direction and second cell extension parts extending in a third direction intersecting the first and second directions.

4. The semiconductor device of claim 3, wherein the cell stack structure and the cell plug are disposed between the first cell extension parts and between the second cell extension parts.

5. The semiconductor device of claim 1, further comprising a dummy stack structure surrounding the cell stack structure,
    wherein the dummy stack structure includes first dummy stack layers and second dummy stack layers, which are alternately stacked.

6. The semiconductor device of claim 5, wherein the cell chip guard penetrates the dummy stack structure.

7. The semiconductor device of claim 6, wherein the cell chip guard includes an upper portion and a lower portion, the upper portion penetrating an upper portion of the dummy stack structure and the lower portion penetrating a lower portion of the dummy stack structure.

8. The semiconductor device of claim 7, wherein a width of the upper portion of the cell chip guard becomes smaller as the width becomes closer to the lower portion of the cell chip guard.

9. The semiconductor device of claim 7, wherein a width of the lower portion of the cell chip guard becomes larger as the width becomes closer to the upper portion of the cell chip guard.

10. The semiconductor device of claim 1, wherein the dummy source structure includes a first dummy source layer, a first etch stop layer, a second dummy source layer, a second etch stop layer, and a third dummy source layer, which are sequentially stacked.

11. A semiconductor device comprising:
    a cell stack structure including stack conductive layers and first cell stack layers, which are alternately stacked;
    a cell plug penetrating the cell stack structure;
    guard plugs surrounding the cell stack structure and the cell plug;
    a dummy source structure connected to the guard plugs; and
    a penetration guard part penetrating the dummy source structure, wherein the guard plugs include a plug semiconductor layer and a plug insulating layer surrounding the plug semiconductor layer, wherein a top surface of the penetration guard part is disposed at substantially the same level as a top surface of the dummy source structure, and wherein a portion of each of the guard plugs is disposed in the dummy source structure and spaced apart from the penetration guard part.

12. The semiconductor device of claim 11, further comprising a substrate including a cell region and a chip guard region surrounding the cell region, wherein the cell stack structure and the cell plug are disposed on the cell region, and the guard plugs are disposed on the chip guard region.

13. The semiconductor device of claim 12, wherein the chip guard region includes first regions extending in a first direction and second regions extending in a second direction intersecting the first direction, and wherein the cell region is disposed between the first regions and between the second regions.

14. The semiconductor device of claim 13, wherein the guard plugs are disposed on the first regions and the second regions.

15. The semiconductor device of claim 11, further comprising a cell source structure connected to the cell plug, wherein the dummy source structure surrounds the cell source structure.

16. The semiconductor device of claim 15, wherein the cell source structure includes a first cell source layer, a second cell source layer, and a third cell source layer, which are sequentially stacked, and wherein the dummy source structure includes a first dummy source layer, a first etch stop layer, a second dummy source layer, a second etch stop layer, and a third dummy source layer, which are sequentially stacked.

17. The semiconductor device of claim 16, wherein the first cell source layer is disposed at substantially the same level as the first dummy source layer, and the third cell source layer is disposed at substantially the same level as the third dummy source layer.

18. A semiconductor device comprising:
a cell stack structure including stack conductive layers and first cell stack layers, which are alternately stacked;
a cell plug penetrating the cell stack structure;
a first cell chip guard surrounding the cell stack structure and the cell plug;
a cell source structure connected to the cell plug;
a first dummy source structure connected to the first cell chip guard; and
a penetration guard part penetrating the first dummy source structure, wherein the first dummy source structure surrounds the cell source structure, wherein a top surface of the penetration guard part is disposed at substantially the same level as a top surface of the first dummy source structure, and wherein a portion of the first cell chip guard is disposed in the first dummy source structure and spaced apart from the penetration guard part.

19. The semiconductor device of claim 18, further comprising a second cell chip guard surrounding the first cell chip guard.

20. The semiconductor device of claim 19, further comprising a second dummy source structure surrounding the first dummy source structure, wherein the second dummy source structure is connected to the second cell chip guard.

21. The semiconductor device of claim 18, wherein a portion of the penetration guard part is disposed at substantially the same level as the portion of the first cell chip guard.

* * * * *